(12) United States Patent
Terazawa et al.

(10) Patent No.: US 8,307,320 B2
(45) Date of Patent: Nov. 6, 2012

(54) METHOD OF PLACING DELAY UNITS OF PULSE DELAY CIRCUIT ON PROGRAMMABLE LOGIC DEVICE

(75) Inventors: Tomohito Terazawa, Okazaki (JP); Shigenori Yamauchi, Nisshin (JP); Takamoto Watanabe, Nagoya (JP)

(73) Assignee: Denso Corporation, Kariya (JP)

(*) Notice: Subject to any disclaimer, the term of this patent is extended or adjusted under 35 U.S.C. 154(b) by 327 days.

(21) Appl. No.: 12/661,156

(22) Filed: Mar. 11, 2010

(65) Prior Publication Data
US 2010/0237923 A1 Sep. 23, 2010

(30) Foreign Application Priority Data
Mar. 19, 2009 (JP) ................... 2009-068509

(51) Int. Cl.
G06F 17/50 (2006.01)
H03H 11/26 (2006.01)
(52) U.S. Cl. .................. 716/122; 716/119; 327/261
(58) Field of Classification Search ............. 716/118, 716/119, 122; 327/261; 326/39
See application file for complete search history.

(56) References Cited

U.S. PATENT DOCUMENTS

| | | | |
|---|---|---|---|
| 5,258,668 A | 11/1993 | Cliff et al. | |
| 5,396,247 A | 3/1995 | Watanabe et al. | |
| 5,477,196 A | 12/1995 | Yamauchi et al. | |
| 5,699,003 A | 12/1997 | Saeki | |
| 6,525,585 B1 | 2/2003 | Iida et al. | |
| 6,924,663 B2 | 8/2005 | Masui et al. | |
| 2004/0177102 A1* | 9/2004 | Nakamura et al. | 708/200 |
| 2006/0290555 A1* | 12/2006 | Watanabe | 341/155 |

FOREIGN PATENT DOCUMENTS

| | | |
|---|---|---|
| JP | 5-259907 | 10/1993 |
| JP | 7-183800 | 7/1995 |
| JP | 07-273639 | 10/1995 |
| JP | 08-054957 | 2/1996 |
| JP | 2000-312137 | 11/2000 |
| JP | 2002-158566 | 5/2002 |
| JP | 2003-198361 | 7/2003 |

OTHER PUBLICATIONS

S. Brown et al, "FPGA and CPLD Architectures: A Tutorial", IEEE Design & Test of Computers, Summer 1996 (pp. 42-57).
Official action #1 dated Aug. 30, 2011 in corresponding Japanese Application No. 2009-068509.
Official action #2 dated Aug. 30, 2011 in corresponding Japanese Application No. 2009-068509.

* cited by examiner

Primary Examiner — Vuthe Siek
(74) Attorney, Agent, or Firm — Harness, Dickey & Pierce, PLC

(57) ABSTRACT

A method of placing delay units of a pulse delay circuit on a programmable logic device having logic cells in each of cell strings has a step of arranging each delay unit in one logic cell of the device such that the delay units are placed in respective specific cell strings aligned in a row direction and a step of serially connecting the delay units with one another as a straight delay line such that the delay units placed in the specific cell strings in the connecting order are aligned in the row direction. In the device, an inter-string transmission delay time on a line between two logic cells of different cell strings differs from an intra-string transmission delay time on a line between two logic cells of one cell string.

11 Claims, 9 Drawing Sheets

METHOD OF PLACING DELAY UNITS OF PULSE DELAY CIRCUIT ON PROGRAMMABLE LOGIC DEVICE

CROSS-REFERENCE TO RELATED APPLICATION

This application is based upon and claims the benefit of priority of the prior Japanese Patent Application 2009-68509 filed on Mar. 19, 2009, so that the contents of which are incorporated herein by reference.

BACKGROUND OF THE INVENTION

1. Field of the Invention

The present invention relates to a method of placing a plurality of delay units of a pulse delay circuit on a programmable logic device to delay a pulse signal in each of the delay units and on a line between two delay units in each pair.

2. Description of Related Art

A pulse delay circuit composed of a plurality of delay units has been utilized to delay a pulse signal in each of the delay units and to transmit the delayed signal to an external device. For example, in Published Japanese Patent First Publication No. H05-259907 and Published Japanese Patent First Publication No. H07-183800, this pulse delay circuit is used for a device such as a time measuring device, an analog-to-digital (A/D) converting device, a digital control oscillating device or the like.

To structure the device using the pulse delay circuit as integrated circuits, logic specifications of a programmable logic device (PLD) such as a field programmable gate array (FPGA) or the like are determined by programming. When the integrated circuits, of which the logic specifications are determined by programming, are laid out onto logic cells of the programmable logic device, the circuits are automatically placed on the device and are connected with one another.

However, in this automatic placement, the delay units are not always located in respective logic cells in the placement required for the proper operation of the pulse delay circuit. That is, because the pulse signal delayed in each delay unit by a unit delay time is further delayed on a transmission line between two delay units in each pair by a transmission delay time, a delay time between two delay units is equal to the sum of the unit delay time in one delay unit and the transmission delay time on a line between the delay units. To appropriately operate the pulse delay circuit, it is required that the delay time between two delay units in each pair is equal to delay times in other pairs of delay units. However, in the automatic placement, the transmission delay times in the pulse delay circuit become considerably different from one another, so that the delay times in pairs of delay units are differentiated from one another. In this case, digital data converted in the A/D converter having the pulse delay circuit, a period of time measured in the time measuring device having the pulse delay circuit or a frequency or phase controlled by the digital control oscillating device having the pulse delay circuit cannot be obtained with high precision.

SUMMARY OF THE INVENTION

An object of the present invention is to provide, with due consideration to the drawbacks of the conventional method of automatically structuring a time measuring device or the like on a programmable logic device, a method of placing a plurality of delay units of a pulse delay circuit on a programmable logic device so as to reduce differences in delay times between the delay units of the pulse delay circuit.

According to a first aspect of this invention, the object is achieved by the provision of a method of structuring a pulse delay circuit having a plurality of delay units on a programmable logic device having a plurality of logic cells in each of a plurality of cell strings, comprising the steps of (1) arranging each of the delay units in one logic cell of the programmable logic device such that the delay units are, respectively, placed in a plurality of specific cell strings aligned in a first direction among the cell strings, and (2) serially connecting the delay units with one another as a straight delay line such that the delay units placed in the specific cell strings in an order of connecting the delay units are aligned in the first direction. In the programmable logic device, an inter-string transmission delay time on a line between two logic cells of different cell strings differs from an intra-string transmission delay time on a line between two logic cells of one cell string.

With this placement of the delay units on the programmable logic device, because the delay units are, respectively, placed in the specific cell strings, a signal delayed in each delay unit is transmitted through lines between the delay units only by inter-string transmissions.

Further, because the delay units placed in the specific cell strings in the connecting order are aligned in the first direction, the inter-string transmission delay times in the inter-string transmissions of the signal can be unified.

Accordingly, although the inter-string transmission delay time differs from the intra-string transmission delay time, the transmission delay times in the pulse delay circuit can be substantially equalized with one another. That is, differences in delay times between the delay units of the pulse delay circuit can be reduced.

According to a second aspect of this invention, the object is achieved by the provision of a method of structuring a pulse delay circuit having a plurality of delay units on the programmable logic device, comprising the steps of (1) arranging each of the delay units in one logic cell of the programmable logic device such that the delay units are placed in the logic cells of a single specific cell string included in the cell strings, and (2) connecting the delay units with one another.

With this placement of the delay units on the programmable logic device, the delay units are arranged in the logic cells of the single specific cell string and are connected with one another. Therefore, a signal delayed in each delay unit is transmitted through a line between two delay units in each pair only by an intra-string transmission between logic cells of the single specific cell string.

Accordingly, although the inter-string transmission delay time differs from the intra-string transmission delay time, the transmission delay times in the pulse delay circuit can be substantially equalized with one another. That is, differences in delay times between the delay units of the pulse delay circuit can be reduced.

It is preferred to place the delay units at equal intervals in the arranging step and to serially connect the delay units with one another as a straight delay line such that the delay units placed in an order of connecting the delay units is aligned in a line.

With this placement of the delay units, even when the intra-string transmission delay time on a line between logic cells in each pair is changed with the distance between the logic cells, differences in the intra string transmission delay times in the pulse delay circuit can be reduced.

According to a third aspect of this invention, the object is achieved by the provision of a method of structuring a pulse delay circuit having a plurality of delay units on the programmable logic device, comprising the steps of (1) arranging each of the delay units in one logic cell of the programmable logic device to place the delay units in a plurality of specific cell strings, included in the cell strings, in a transmission order and to place a part of the delay units, consecutively aligned in the transmission order, in one specific cell string at specific intervals such that the intra-string transmission delay time on a line between two delay units, spaced by the specific interval, in the part of the delay units is substantially equalized with the inter-string transmission delay time on a line between two delay units consecutively aligned in the transmission order in two specific cell strings, and (2) connecting two delay units, consecutively aligned in the transmission order, in each pair with each other so as to transmit a signal through the delay units in the transmission order. In the programmable logic device, the inter-string transmission delay time on a line between two logic cells of different cell strings differs from the intra-string transmission delay time on a line between two logic cells successively aligned in one cell string.

With this placement of the delay units on the programmable logic device, the delay units are placed in respective logic cells of the specific cell strings in the transmission order, while a part of the delay units consecutively aligned in the transmission order are placed in one specific cell string. Then, two delay units, consecutively aligned in the transmission order, in each pair are connected with each other.

Therefore, two delay units in each pair, spaced at the specific interval, in the part of the delay units are connected with each other so as to delay the signal by the intra-string transmission delay time on a line between the two delay units connected with each other. In contrast, two delay units in each pair, consecutively aligned in the transmission order but different from the two delay units in the part of the delay units, are placed in different specific cell strings and are connected with each other so as to delay the signal by the inter-string transmission delay time.

Although the signal is delayed by the intra-string transmission delay times in one specific cell string of the part of the delay units and is delayed by the inter-string transmission delay times between different cell strings, the intra-string transmission delay times are substantially equalized with the inter-string transmission delay times.

Accordingly, although the inter-string transmission delay time differs from the intra-string transmission delay time in the intra-string transmission between two logic cells successively aligned in one cell string, the transmission delay times in the pulse delay circuit can be substantially equalized with one another. That is, differences in delay times between the delay units of the pulse delay circuit can be reduced.

According to a fourth aspect of this invention, the object is achieved by the provision of a method of structuring a pulse delay circuit having a plurality of delay units on the programmable logic device, comprising the steps of (1) arranging each of the delay units in one logic cell of the programmable logic device to place the delay units in a plurality of specific cell strings, included in the cell strings, in a transmission order and to place a part of the delay units, consecutively aligned in the transmission order, in one specific cell string, (2) forming each delay unit, preceding another delay unit in the transmission order in the part of the delay units, by a first logic element having a first delay time, (3) forming each of the delay units other than the delay unit or the delay units, formed by the first logic element or the first logic elements, by a second logic element having a second delay time shorter than the first delay time of the first logic element, and (4) connecting two delay units, consecutively aligned in the transmission order, in each pair with each other so as to transmit a signal through the delay units in the transmission order. In the programmable logic device, an inter-string transmission delay time on a line between two logic cells of different cell strings is longer than an intra-string transmission delay time on a line between two logic cells of one cell string.

With this placement of the delay units on the programmable logic device, the signal is delayed on an output line of each delay unit, preceding another delay unit in the transmission order in the part of the delay units, by the intra-string transmission delay time. In contrast, the signal is delayed on an output line of each delay unit of one cell string preceding another delay unit of another cell string in the transmission order, by the inter-string transmission delay time.

To substantially equalize delay times between the delay units with one another against this mixture of the intra-string transmission delay time and the inter-string transmission delay time different from each other, the delay unit preceding another delay unit in the part of the delay units is formed by the first logic element, and the delay unit of one cell string preceding another delay unit of another cell string is formed by the second logic element having the delay time shorter than that of the first logic element.

Accordingly, although the inter-string transmission delay time is longer than the intra-string transmission delay time, the sum of a unit delay time in each delay unit and a transmission delay time on an output line of the delay unit can be substantially set at a constant value. That is, differences in delay times between the delay units of the pulse delay circuit can be reduced.

DETAILED DESCRIPTION OF THE PREFERRED EMBODIMENTS

Figure 1:
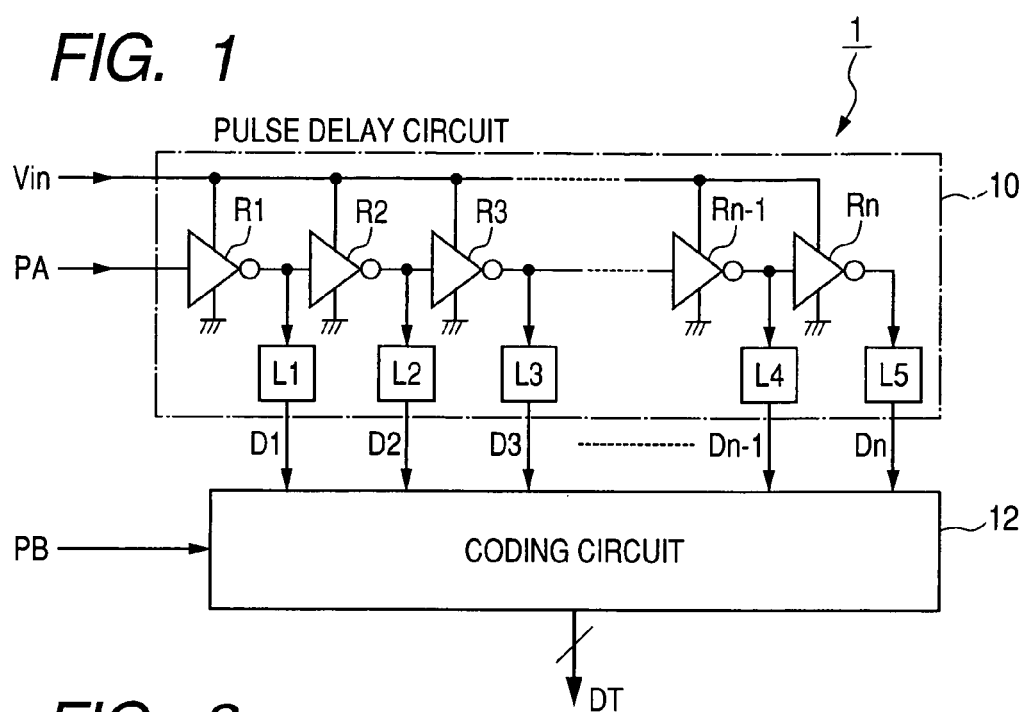
FIG. 1 is a structure view of a time measuring device having a pulse delay circuit according to first and second embodiments of the present invention.

Embodiments of the present invention will now be described with reference to the accompanying drawings, in which like reference numerals indicate like parts, members or elements throughout the specification unless otherwise indicated.

First Embodiment

FIG. 1 is a structure view of a time measuring device having a pulse delay circuit according to the first embodiment.

As shown in FIG. 1, a time measuring device 1 has a pulse delay circuit 10 and a coding circuit 12. The circuit 10 has a plurality of delay units R1 to Rn (sometimes called delay units R) and a plurality of latch circuits L1 to Ln. The delay units R1 to Rn are serially connected with one another in that order. The delay units R1 to Rn are structured as a straight delay line (SDL). Each delay unit Ri (i=1, 2, 3, - - - , n) is formed by a NOT gate (i.e., inverter). Each delay unit Ri receives a driving voltage Vin. A pulse signal PA is delayed in each of the delay units R1 to Rn by a delay time (hereinafter, called a unit delay time). When the signal PA has just passed through each delay unit Ri, the level of a delayed signal Di at an output line of the delay unit Ri is changed. The unit delay time in each delay unit Ri depends on the level of the driving voltage Vin, and these unit delay times of the delay units R1 to Rn are, for example, equalized with one another. The latch circuits L1 to Ln, respectively, latch the delayed signals (or outputs) D1 to Dn outputted from output lines of the delay units R1 to Rn.

The coding circuit 12 produces digital data DT from the delayed signals D1 to Dn latched in the latch circuits L1 to Ln in response to a measuring pulse PB. This data DT indicates the number of delay units R, through which the signal PA has passed during a period of time from the inputting of the pulse PA to the inputting of the pulse PB.

The device 1 is structured by determining logic specifications of a field programmable gate array (FPGA) representing a programmable logic device (PLD) by programming, and this device 1 is located on the FPGA.

As is well known, this FPGA has an input/output (I/O) interface through which data are transmitted between the FPGA and pins connected with external devices, a plurality of logic cells composed of either look-up tables or flip-flops to realize logic circuits, and internal wirings (i.e., a switch matrix) connecting the logic cells with one another and connecting a part of logic cells with the I/O interface.

Especially, the FPGA has a large number of strings (or columns) of logic cells (hereinafter, called cell strings), and the logic cells are placed in a matrix shape in the cell strings. In each cell string, a plurality of logic cells are successively aligned along a column direction. The cell strings are aligned substantially at equal intervals along a row direction perpendicular to the column direction. During the transmission (hereinafter, called intra-string transmission) of a signal between two logic cells of the same cell string, the signal is delayed by a delay time (hereinafter, called an intra-string transmission delay time). During the transmission (hereinafter, called inter-string transmission) of a signal between two cells of different cell strings adjacent to each other, the signal is delayed by a delay time (hereinafter, called an inter-string transmission delay time). The inter-string transmission delay time is generally longer than the intra-string transmission delay time. For example, in case of the FPGA formed by 130 nm process rule, the intra-string transmission delay time ranges from 250 ps to 400 ps, while the inter-string transmission delay time is approximately 650 ps. Therefore, the inter-string transmission delay time is almost 1.6 to 2.6 times longer than the intra-string transmission delay time. The intra-string transmission delay time between cells adjacent to each other is minimized to 250 ps. As the distance of two cells in the same string is increased, the intra-string transmission delay time between the two cells becomes longer. When two cells in the same string are spaced from each other by a certain distance, the intra-string transmission delay time between the two cells can substantially become equal to the inter-string transmission delay time between two cells adjacent to each other in the row direction.

Further, the FPGA is connected with a plurality of power sources having different supply voltages. The cells of the FPGA are classified into a plurality of cell units. Each cell unit is composed of one logic cell, a plurality of logic cells located in the same cell string, or a plurality of logic cells located in different cell strings. Each logic cell belongs to only one cell unit or a plurality of cell units. Each cell unit can select one of the power sources, and the cells of each cell unit receive electric power from the selected power source. Each cell unit is called a power supplied unit.

Moreover, in the general programming of the FPGA, the placement of circuit elements composing the device 1 is automatically set, so that the elements are automatically located in respective logic cells of the FPGA. However, in this embodiment, a part of circuit elements or all elements are manually located in respective logic cells of the FPGA. For example, the placement of the delay units R1 to Rn and latch circuits L1 to Ln in the device 1 is manually set.

Figure 2:
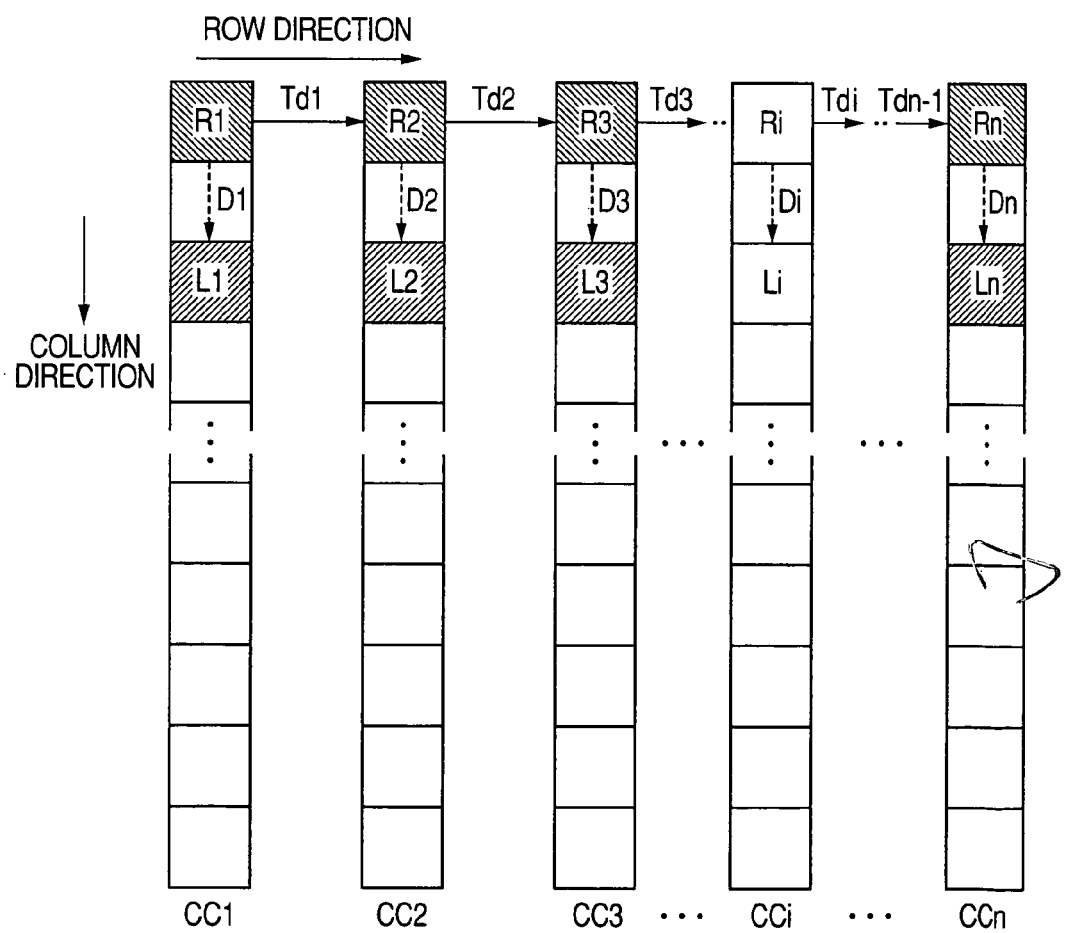
FIG. 2 is a view showing the placement of delay units and latch circuits of the pulse delay circuit on an FPGA according to the first embodiment.

FIG. 2 is a view showing the manual placement of delay units R1 to Rn and latch circuits L1 to Ln of the circuit 10 on the FPGA.

As shown in FIG. 2, each of the delay units R1 to Rn is arranged or located in a specific logic cell of one cell string on the FPGA to place the delay units R1 to Rn in a plurality of specific cell strings CC1 to CCn aligned in that order in the row direction, respectively. Then, the delay units R1 to Rn are serially connected with one another in that order such that the delay units R1 to Rn placed in the cell strings CC1 to CCn in the connecting order of the delay units R1 to Rn are aligned in a line along the row direction. Because the delay units R1 to Rn are, respectively, placed in the cell strings CC1 to CCn, the signal PA is not transmitted in the circuit 10 by any intra-string transmission but is transmitted by the inter-string transmission. The signal PA is delayed between the delay units Rj and Rj+1 (j=1, 2, 3, - - - , n−1) in each pair by a delay time (hereinafter, called an inter-string delay time) Tdj. This delay time Tdj is equal to the sum of an inter-string transmission delay time on the inter-string line between the delay units Rj and Rj+1 and the unit delay time in the delay unit Rj.

The positions of the specific logic cells in the corresponding cell strings CC1 to CCn are the same, to place the delay units R1 to Rn at equal intervals on the FPGA. In this embodiment, each delay unit Ri (i=1, 2, - - - , n) is, for example, arranged in the top logic cell of the cell string CCi.

Further, each latch circuit Li latching the delayed signal Di is arranged or located in one logic cell of the cell string CCi in which the delay unit Ri outputting the delayed signal Di is arranged. The logic cells having the latch circuits L1 to Ln are determined such that the relative positions of the latch circuits L1 to Ln to the corresponding delay units Ri to Rn are the same. Therefore, the transmission times of the delayed signals D1 to Dn from the straight delay line to the latch circuits L1 to Ln are substantially equalized to one another. In this case, the delayed signals D1 to Dn outputted from the straight delay line at the same time are simultaneously latched in the respective latch circuits L1 to Ln. In this embodiment, each latch circuit Li is, for example, arranged in the third logic cell of the cell string CCi.

Moreover, the driving voltage Vin of one power source is applied to the minimum power supplied unit having the specific logic cells of the delay units R1 to Rn. This power source may be used only for the time measuring device 1, or the voltage of this power source may be applied to another power supplied unit.

The driving voltage Vin is fixed so as to set the unit delay times of the delay units R1 to Rn at a constant value. When the level of the signal PA is changed from the low level to the high level to start the transmission of the signal PA in the circuit 10, the signal PA is transmitted through the delay units R1 to Rn while being delayed between adjacent delay units Rj and Rj+1 (j=1, 2, 3, - - -, n−1) connected with each other in each pair. The level of the signal PA is changed in each delay unit Ri when the signal PA has just passed through the delay unit Ri. The signal PA at the output line of each delay unit Ri is latched by the latch circuit Li as the delayed signal Di. The level change timing of the delayed signal Dj is delayed from the level change timing of the delayed signal Dj−1 (the level change timing of the delayed signal D0 denotes the input timing of the signal PA to the delay unit R1) by the inter-string delay time Tdj.

Thereafter, when the pulse PB is inputted to the coding circuit 12 at an arbitrary timing, the circuit 12 detects the number of delay units R, through which the signal PA has passed during a period of time from the inputting of the pulse PA to the inputting of the pulse PB, from the levels of the delayed signals Di received from the latch circuits L1 to Ln at the input timing of the pulse PB. Then, the circuit 12 outputs digital data DT indicating the detected number.

Therefore, a control unit (not shown) can detect a period of time from the inputting of the pulse PA to the inputting of the pulse PB from the digital data DT and the common value of the inter-string delay times Td1 to Tdn−1. The resolution in the detection of the level changing timing of each delayed signal Di depends on the inter-string delay time Tdi.

With this placement of the delay units in the pulse delay circuit 10, because the delay units R1 to Rn are, respectively, placed in the cell strings CC1 to CCn, the signal PA is transmitted in the circuit 10 only by the inter-string transmission. In this case, the signal PA is delayed on inter-string lines between the delay units R1 to Rn by the inter-string delay times Td1 to Tdn−1. Further, because the delay units R1 to Rn placed in the connecting order are aligned along the row direction, the inter-string lines are substantially equalized with one another. Therefore, the inter-string delay times Td1 to Tdn−1 are substantially equalized with one another. Especially, because the positions of the specific logic cells in the corresponding cell strings CC1 to CCn are the same, the delay units R1 to Rn are placed at equal intervals on the FPGA. Therefore, the inter-string lines are equalized with one another, so that the inter-string delay times Td1 to Tdn−1 are equalized with one another with high precision. Because the inter-string delay times Td1 to Tdn−1 are equalized with one another, the resolution in the detected period of time, determined by the inter-string delay times Td1 to Tdn−1, become stable.

Accordingly, although the time measuring device 1 is realized in the FPGA representing the PLD, the delay times between the delay units can be substantially equalized with one another, and the detected period of time can be always obtained at the uniform resolution.

In this embodiment, the positions of the delay units R1 to Rn in the corresponding cell strings are the same to substantially equalize the inter-string delay times Td1 to Tdn−1 with one another. However, the position of the delay unit Rj in each cell string CCj may be set to be differentiated from the position of the adjacent delay unit Rj+1 in the corresponding cell string CCj+1 by a distance corresponding to a predetermined number of logic cells. The relative positions of the latch circuits L1 to Ln to the corresponding delay units R1 to Rn are set to be the same. In this case, although the inter-string delay times Td1 to Tdn−1 are increased, the inter-string delay times Td1 to Tdn−1 can be substantially equalized with one another.

Further, in this embodiment, the pulse delay circuit 10 is used for the time measuring device 1. However, the circuit 10 may be used for an A/D converter. More specifically, a measured device acting as one power source outputs a voltage signal of which the level is changed with time. The minimum power supplied unit having the specific logic cells of the delay units R1 to Rn receives this voltage signal as electric power. None of the other power supplied units receives this voltage signal. Therefore, the voltage signal is inputted to the circuit 10 as the driving voltage Vin so as to change the unit delay time of each delay unit with time. The signal PA and the pulse PB set at a predetermined time interval are inputted to the A/D converter. In this case, a control unit calculates the common value of the inter-string delay times Td1 to Tdn−1 from the predetermined time interval and the detected number indicated by the digital data DT and calculates the unit delay time from the calculated inter-string delay time and the inter-string transmission delay time. Therefore, the level of the voltage signal can be detected from the calculated unit delay time.

Second Embodiment

Figure 3:
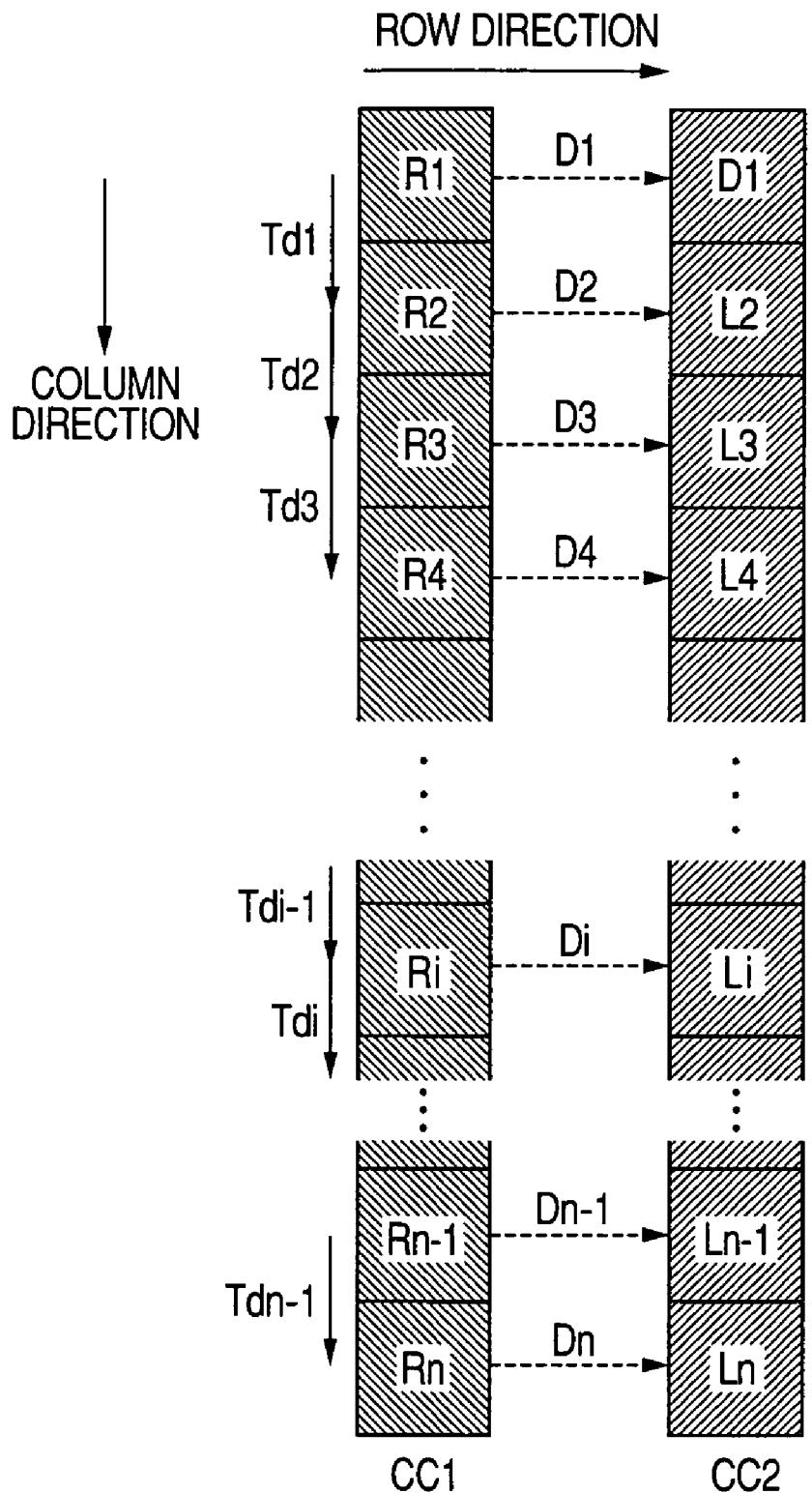
FIG. 3 is a view showing the placement of delay units and latch circuits of the pulse delay circuit on an FPGA according to the second embodiment.

In this embodiment, the delay units R1 to Rn to be serially connected with one another are manually placed in a single cell string on the FPGA. FIG. 3 is a view showing the manual placement of the delay units R1 to Rn and latch circuits L1 to Ln of the pulse delay circuit 10 shown in FIG. 1 on the FPGA according to the second embodiment.

As shown in FIG. 3, each of the delay units R1 to Rn of the circuit 10 is arranged in a specific logic cell of a cell string CC1 such that the delay units R1 to Rn are placed in the specific logic cells of the single cell string CC1 at equal intervals along the column direction. Then, the delay units R1 to Rn are serially connected with one another in that order as a straight delay line such that the delay units R1 to Rn, placed in the connecting order, are aligned at equal intervals in a line in the column direction. In this embodiment, the delay units R1 to Rn are, for example, arranged in the specific logic cells successively aligned in the cell string CC1.

Because the delay units R1 to Rn are placed in the single cell string CC1, the signal PA is not transmitted in the circuit 10 by any inter-string transmission but is transmitted by the intra-string transmission. The signal PA is delayed between the delay units Rj and Rj+1 (j=1, 2, 3, - - -, n−1) in each pair by a delay time (hereinafter, called an intra-string delay time) Tdj. This delay time Tdj is equal to the sum of an intra-string transmission delay time on the intra-string line between the delay units Rj and Rj+1 and the unit delay time in the delay unit Rj. The level change timing of the delayed signal Dj is delayed from the level change timing of the delayed signal Dj−1 (the level change timing of the delayed signal D0 denotes the input timing of the signal PA to the delay unit R1) by the intra-string delay time Tdj.

The latch circuits L1 to Ln are, respectively, arranged in n logic cells of the cell string CC2 adjacent to the cell string CC1 having the delay units R1 to Rn. Each latch circuit Li is placed to face the delay unit Ri along the row direction. That is, the positions of the latch circuits L1 to Ln in the cell string CC2 are the same as the positions of the corresponding delay unit R1 to Rn in the cell string CC1. Therefore, the transmission times of the delayed signals D1 to Dn from the straight delay line to the latch circuits L1 to Ln are substantially equalized with one another. That is, the delayed signals D1 to Dn outputted from the straight delay line at the same time are simultaneously latched in the respective latch circuits L1 to Ln. In this embodiment, the latch circuits L1 to Ln are, for example, arranged in that order every logic cell of the cell string CC2.

With this placement of the delay units in the pulse delay circuit 10, because the delay units R1 to Rn are placed in the single cell string CC1, the signal PA is transmitted in the circuit 10 only by the intra-string transmission. In this case, the signal PA are delayed on intra-string lines between the delay units R1 to Rn by the intra-string delay times Td1 to Tdn−1. Further, because the delay units R1 to Rn placed in the connecting order are aligned at equal intervals along the column direction, the intra-string lines are equalized with one another. Therefore, the intra-string delay times Td1 to Tdn−1 are equalized with one another. Because the intra-string delay times Td1 to Tdn−1 are equalized with one another, the resolution in the detected period of time, determined by the intra-string delay times Td1 to Tdn−1, become stable.

Accordingly, although the time measuring device 1 is realized in the FPGA representing the PLD, the delay times of the signal PA between the delay units can be substantially equalized with one another, and the detected period of time can be always obtained at the uniform resolution in the same manner as in the first embodiment.

Further, as compared with the inter-string delay times in the first embodiment, the intra-string delay times Td1 to Tdn−1 in the second embodiment can be shortened. Therefore, the resolution in the detection of the period of time can be heightened. Especially, because the specific logic cells having the delay units R are adjacent to one another, each intra-string delay time Tdj is minimized. Accordingly, the resolution can be heightened to the level corresponding to the best limitation of the performance of the FPGA.

In this embodiment, the delay units R are arranged in the logic cells adjacent to one another in one cell string. However, the delay units R may be arranged in the logic cells spaced from one another by a distance corresponding to a predetermined number of logic cells. In this case, each latch circuit Li is placed in the adjacent cell string to face the corresponding delay unit Ri along the row direction.

Third Embodiment

Figure 4:
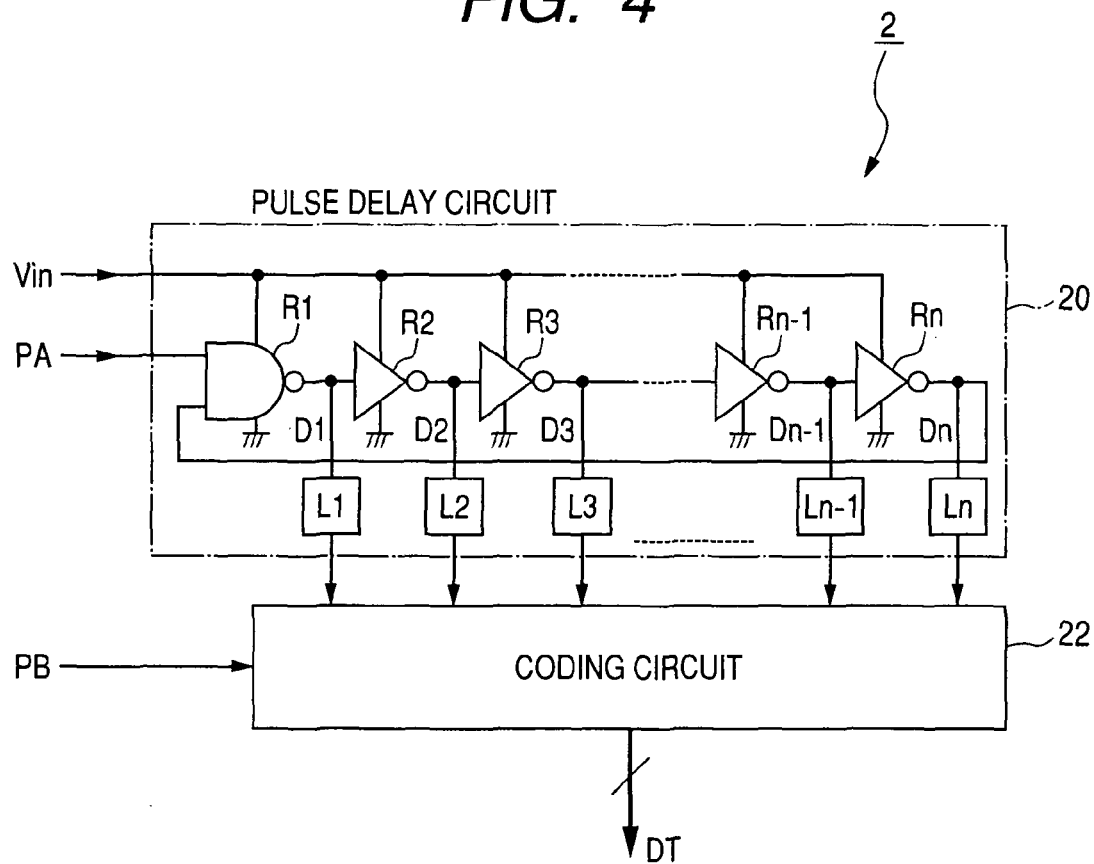
FIG. 4 is a structure view of a time measuring device having a pulse delay circuit according to third, fourth and fifth embodiments of the present invention.

FIG. 4 is a structure view of a time measuring device having a pulse delay circuit according to the third embodiment.

As shown in FIG. 4, a time measuring device 2 has a pulse delay circuit 20 and a coding circuit 22. The circuit 20 has a plurality of delay units R1 to Rn and a plurality of latch circuits L1 to Ln. The delay units R1 to Rn are connected with one another in that order in a ring shape to be structured as a ring delay line (RDL). The first delay unit R1 is formed by an NAND gate and receives a pulse signal PA and an output of the n-th delay unit Rn. Each of the delay units R2 to Rn is formed by a NOT gate (i.e., inverter). Each of the delay units R1 to Rn receives a driving voltage Vin. The signal PA is delayed in each delay unit by a unit delay time depending on the level of the driving voltage Vin. These unit delay times of the delay units R1 to Rn are set to be equal to one another. The latch circuits L1 to Ln, respectively, latch the delayed signals D1 to Dn outputted from output lines of the delay units R1 to Rn.

The coding circuit 22 has a counter for counting a circulation number of the signal PA circulated through the delay units R1 to Rn, and a latch circuit for latching the circulation number. When the level of the signal PA is changed to the high level, the signal PA starts on circulating through the delay units R1 to Rn. That is, output levels of the delay units R1 to Rn are changed one after another as if the signal PA is repeatedly circulated through the delay units R1 to Rn in that order. Each time the signal PA is circulated through the delay units R1 to Rn, the output level of the delay unit Rn is changed. The counter increments a counting value each time the output level of the delay unit Rn is changed. Therefore, the counting value indicates a circulation number of the signal PA. When a measuring pulse PB is inputted to the circuit 22, the circuit 22 detects the number of delay units R, through which the signal PA has passed during a period of time from the inputting of the pulse PA to the inputting of the pulse PB, from the circulation number and the delayed signals D1 to Dn latched in the latch circuits L1 to Ln. Then, the circuit 22 produces and outputs digital data DT indicating the detected number.

Therefore, as compared with the pulse delay circuit 10 having delay units structured as a straight delay line, the number of delay units can be considerably reduced in the pulse delay circuit 20. This type of circuit having delay units structured as a ring delay line (RDL) is well known.

Figure 5:
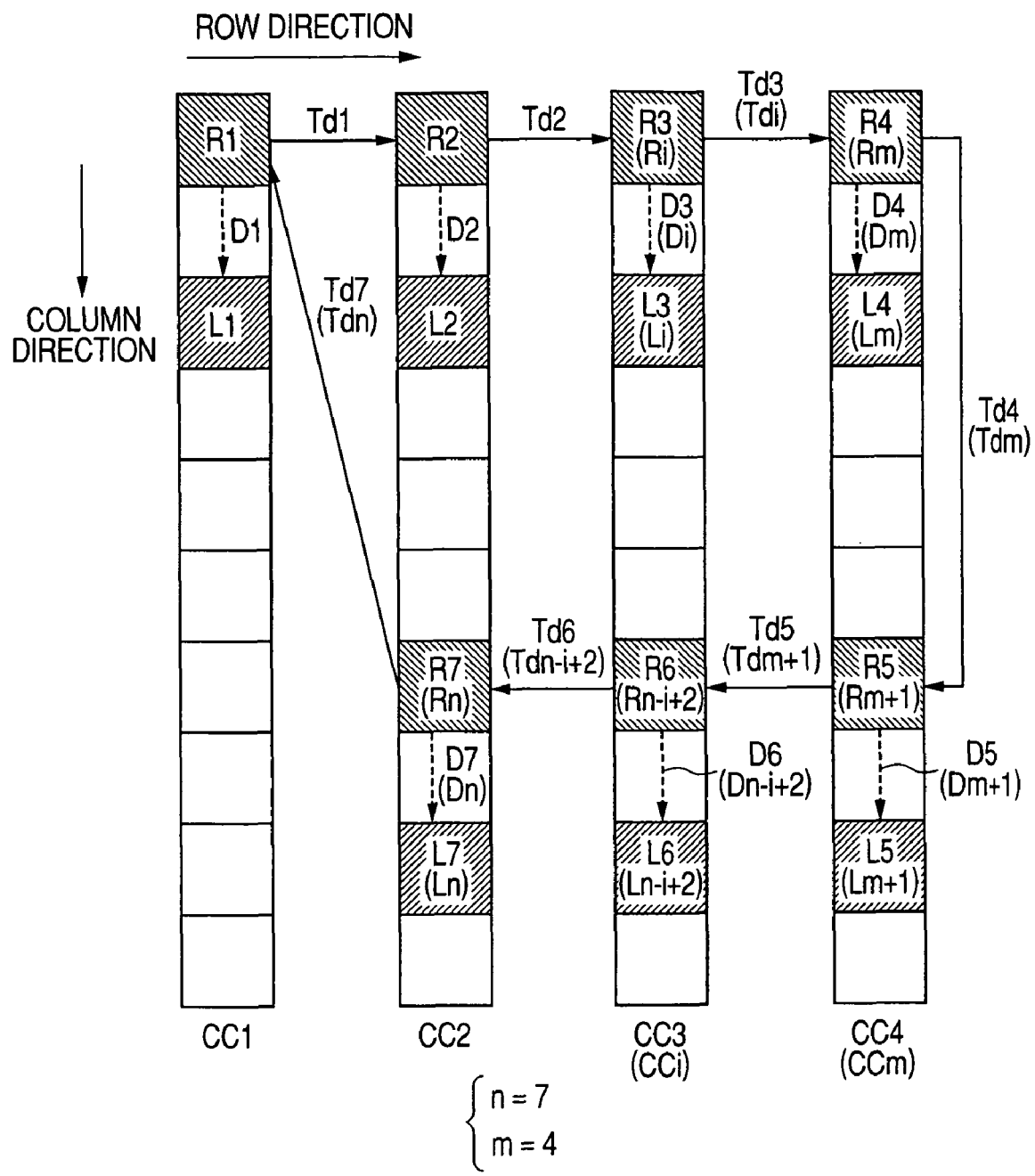
FIG. 5 is a view showing the placement of delay units and latch circuits of the pulse delay circuit on an FPGA according to the third embodiment.

In this embodiment, the delay units R1 to Rn are manually placed in a plurality of cell strings on the FPGA in a transmission order of the signal PA to transmit the signal PA on lines of one cell string by intra-string transmissions and to transmit the signal PA on other lines by inter-string transmissions. FIG. 5 is a view showing the manual placement of the delay units R1 to R7 and latch circuits L1 to L7 of the circuit 20 on the FPGA.

As shown in FIG. 5, each of the delay units R1 to Rn (e.g., n=7) is arranged in a specific logic cell of the FPGA to place the delay units R1 to Rm (m=(n+1)/2) in a plurality of cell strings CC1 to CCm, aligned in that order, in the transmission order along the row direction and to place the delay units Rm+1 to Rn in the cell strings CC2 to CCm, aligned in that order, in the transmission order along the direction opposite to the row direction. Therefore, the delay unit Rn is placed to be close to the delay unit R1.

A part of the delay units Rm and Rm+1 consecutively aligned in the transmission order are arranged at specific intervals in the cell string CCm along the column direction. The intra-string transmission delay time Tdm on a line between two delay units Rm and Rm+1 spaced by the specific interval in the part of the delay units is substantially equalized with the inter-string transmission delay time (e.g., Tdm−1) on a line between two delay units R (e.g., Rm−1 and Rm) consecutively aligned in the transmission order in the cell strings (e.g., CCm−1 and CCm). Then, the delay units R1 to Rn are connected with one another in the transmission order in a ring shape while connecting the delay units R1 and Rn with each other. More specifically, two delay units, consecutively aligned in the transmission order, in each pair are connected with each other. Therefore, the signal PA is transmitted through the delay units R1 to Rn in the transmission order.

More specifically, the delay units R1 to Rm (e.g., m=4) are, respectively, arranged in specific logic cells of the cell strings CC1 to CCm such that the delay units R1 to Rm are placed in the row direction in that order. That is, each delay unit Ri (i=1, 2, - - - , m) is placed in the cell string CCi. The delay units Rm+1 to Rn (e.g., n=7) are arranged in other specific logic cells of the cell strings CC2 to CCm such that the delay units Rm+1 to Rn are placed in that order in the direction opposite to the row direction. That is, each delay unit Rn−i+2 (i=2, - - - , m) is placed in the cell string CCi. Therefore, the delay unit Rn is placed in the cell string CC2 closest to the cell string CC1 having the delay unit R1. For example, each delay unit Ri is arranged in the top logic cell of the cell string CCi, and each of the delay units Rn−i+2 is arranged in the seventh logic cell of the cell string CCi.

The signal PA is transmitted between the delay units R1 and Rm and between the delay units Rm+1 and Rn by the inter-string transmission while being delayed between the delay units Rj and Rj+1 (j=1, 2, - - - , m−1, m+1, - - - , n; Rn+1 denotes R1) in each pair by the inter-string delay time Tdj. The signal PA is transmitted between the delay units Rm and Rm+1 by the intra-string transmission while being delayed by the intra-string delay time Tdm.

The specific logic cells of the delay units R1 to Rm are determined such that the positions of the delay units R1 to Rm in the corresponding cell strings CC1 to CCm are the same. Therefore, the inter-string delay times Td1 to Tdm−1 are equalized with one another. Further, the specific logic cells of the delay units Rn−i+2 (i=2, - - - , m) in the cell strings CCi are the same. Therefore, the inter-string delay times Tdm+1 to Tdn−1 are equalized with one another. Moreover, the inter-string delay time Tdn is substantially equal to the other inter-string delay times.

The specific interval between the delay units Rm and Rm+1 in the cell strings CCm is set such that the intra-string delay time Tdm substantially becomes equal to the inter-string delay times Td1 to Tdm−1, and Tdm+1 to Tdn. Therefore, each delay unit Rn−i+2 is spaced from the delay unit Ri by an adjusted distance in the cell string CCi. This setting is performed while referring to a simulated value of the delay time on the line between circuit elements displayed when the manual wiring is performed by using an FPGA development tool.

Further, each latch circuit Li (i=1, - - - , n) is arranged in one logic cell of the cell string CCi or CCn−i+2 in which the delay unit Ri is arranged. The positions of the logic cells having the latch circuits L1 to Ln in the corresponding cell strings CC1 to CCm are set such that the relative positions of the latch circuits L1 to Ln to the corresponding delay units R1 to Rn are the same.

With this placement of the delay units in the pulse delay circuit 20, the pulse PA is transmitted by the inter-string transmission between the delay units R1 to Rm, between the delay units Rm+1 to Rn and between the delay units Rn and R1 and is transmitted by the intra-string transmission between the delay units Rm and Rm+1. To equalize the intra-string transmission delay time based on the intra-string transmission with the inter-string transmission delay time based on the inter-string transmission, the distance of the delay unit Rm and Rm+1 in the cell string CCm is adjusted in the placement of the delay units R1 to Rn so as to substantially equalize the delay times Td1 to Tdn with one another.

Accordingly, even when the delay units R1 to Rn of the pulse delay circuit 20 structured by a ring delay line (RDL) are arranged in the cell strings CC1 to CCm (m=(n+1)/2) to place a plurality of delay units in the cell string CCm and to transmit the signal PA in a group of delay units by the intra-string transmission and in another group of delay units by the inter-string transmission, the delay times Td1 to Tdn can be substantially equalized with one another by adjusting distances among the delay units in the cell string CCm. As a result, in the time measuring device 2 realized in the FPGA representing the PLD, the delay times in the pairs of delay units can be substantially equalized with one another, and a period of time, from the inputting of the signal PA to the inputting of the pulse PB, can be always detected from the digital data DT and the common value of the delay times Td1 to Tdn at the uniform resolution.

Further, because the circuit 20 is structured by the RDL, the number of delay units can be considerably reduced as compared with that in a circuit structured by a straight delay line (SDL). As a result, the working load in the manual placement of the delay units can be considerably reduced.

In this embodiment, the number of delay units in the cell string CCm (e.g., m=4) is two, so that the signal PA is delayed by the intra-string delay time only on a line between these delay units. However, the number of delay units consecutively aligned in the connecting order in one cell string may be three or more so as to arrange these delay units every adjusted number of logic cells. In this case, the signal PA is delayed by the intra-string delay time on each of transmission lines in the cell string.

Further, in this embodiment, the delay units R1 to Rn are connected with one another in a ring shape. However, the delay units R1 to Rn may be serially connected with one another to apply the pulse delay circuit to the device shown in FIG. 1. More specifically, when cell strings CC1 to CCn−1 are aligned in that order, each delay unit Ri (i=m+1, - - - , n) is arranged in one logic cell of the cell string CCi−1.

Moreover, in this embodiment, the positions of the delay units R1 to Rm in the corresponding cell strings are the same. However, the position of the delay unit Rj (j=1, - - - , m−1) in the cell string CCj may be differentiated from the position of the delay unit Rj+1 in the cell string CCj+1 by a distance corresponding to a predetermined number of logic cells. In this case, the relative positions of the delay units Rn−i+2 (i=2, - - - , m) to the delay units Ri are maintained at the adjusted distance.

Furthermore, in this embodiment, in case of two delay units in the cell string Cm, in place of the adjustment of the distance between these delay units, the unit delay time of the delay unit Rm may be set to be longer than the unit delay times of the other delay units to substantially equalize the intra-string delay time Tdm with the inter-string delay times Td1 to Tdm−1, and Tdm+1 to Tdn. For example, the delay unit Rm is formed by an NAND gate, while each of the other delay units is formed by a NOT gate having a unit delay time shorter than that of the NAND gate. In this case, the pulse PA is inputted to the delay unit Rm in place of the delay unit R1.

Still further, in this embodiment, an odd number of delay units are used in the circuit 20. However, when an AND gate is used in place of the NAND gate R1, an even number of delay units may be used. In this case, the delay units Rm+1 to Rn (m=n/2) are arranged in specific logic cells of the cell strings CC1 to CCm different from specific logic cells of the delay units R1 to Rm, and the delay units Rm+1 to Rn aligned in that order are placed in the direction opposite to the row direction. That is, each delay unit Rn−i+1 (i=1, - - - , m) is placed in the cell string CCi.

Modification of Third Embodiment

Figure 6A:
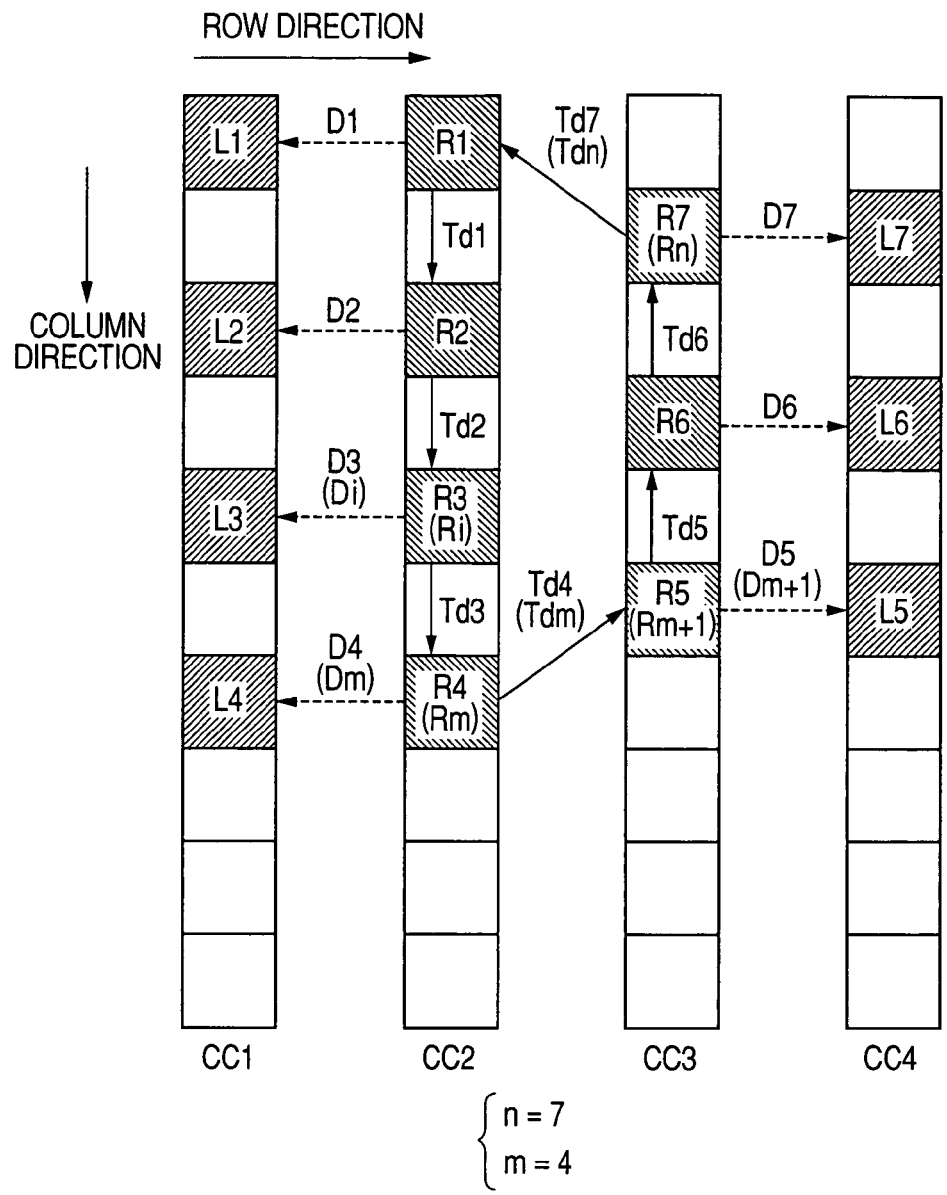
FIG. 6A is a view showing the placement of delay units and latch circuits of the pulse delay circuit on an FPGA according to a modification of the third embodiment.
Figure 6B:
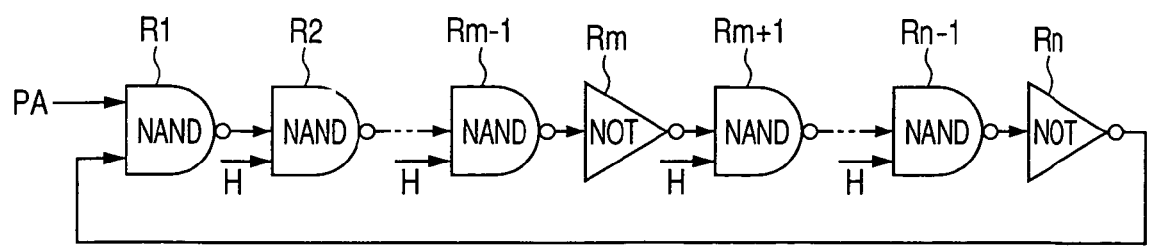
FIG. 6B is a view showing delay units formed by NAND gates and NOT gates according to the modification of the third embodiment.

In this modification, the delay units R1 to Rn are manually placed in a plurality of cell strings on the FPGA in a transmission order of the signal PA to transmit the signal PA on lines of each cell string by an intra-string transmission and to transmit the signal PA on lines between cell strings by an inter-string transmission. FIG. 6A is a view showing the manual placement of the delay units R1 to R7 and latch circuits L1 to L7 of the circuit 20 shown in FIG. 4 on the FPGA according to a modification of the third embodiment. FIG. 6B is a view showing the delay units R1 to R7 formed by NAND gates and NOT gates according to the modification of the third embodiment.

As shown in FIG. 6A, each of the delay units R1 to Rn (e.g., n=7) is arranged in a specific logic cell of the FPGA to place the delay units R1 to Rn in a plurality of cell strings CC2 and CC3, aligned in that order, in the transmission order. A first part of the delay units Ri to Rm (m=(n+1)/2) consecutively aligned in the transmission order are placed in the cell string CC2 at equal intervals (e.g., every two logic cells) along the column direction. A second part of the delay units Rm+1 to Rn consecutively aligned in the transmission order are placed in the cell string CC3 at the equal intervals along the direction opposite to the column direction. The delay unit Rm+1 is placed at the mid point between the delay units Rm-1 and Rm in the column direction. Therefore, the delay unit Rn is placed to be close to the delay unit R1.

Then, the delay units R1 to Rn are connected with one another in the transmission order in a ring shape while connecting the delay units R1 and Rn with each other. Therefore, the signal PA is transmitted through the delay units R1 to Rn connected with one another in the transmission order.

The signal PA is transmitted between the delay units R1 and Rm and between the delay units Rm+1 and Rn by the intra-string transmission while being delayed between the delay units Rj and Rj+1 (j=1, 2, - - - , m-1, m+1, - - - , n-1) in each pair by the intra-string delay time Tdj. The signal PA is transmitted between the delay units Rm and Rm+1 and between the delay units Rn and R1 by the inter-string transmission while being delayed by the inter-string delay times Tdm and Tdn.

The delay units R1 to Rm of the cell string CC2 are arranged in the specific logic cells aligned at equal intervals, and the delay units Rm+1 to Rn of the cell string CC3 are arranged in the specific logic cells aligned at the equal intervals. Therefore, the intra-string delay times Td1 to Tdm-1, and Tdm+1 to Tdn-1 are substantially equalized with one another. Further, the specific logic cells for the delay units Rm+1 to Rn in the cell string CC3 are determined such that the distance between the delay units Rm and Rm+1 is the same as the distance between the delay units Rn and R1. Therefore, the inter-string delay times Tdm and Tdn are substantially equalized with one another.

In this modification, each delay unit Ri (i=1, 2, - - - , m) of the cell string CC2 is arranged in the (2i-1)-th logic cell, and each delay unit Ri (i=m+1, - - - , n) of the cell string CC3 is arranged in the (4m-2i)-th logic cell.

In these delay units, assuming that the unit delay times of the delay units Rj (j=1, 2, - - - , m-1, m+1, - - - , n-1) are equal to the unit delay times of the delay units Rm and Rn, the common value of the intra-string delay times Tdj becomes lower than the common value of the inter-string delay times Tdm and Tdn. In this modification, to equalize the common value of the intra-string delay times Tdj with the common value of the inter-string delay times Tdm and Tdn, the unit delay times of the delay units Rm and Rn are set to be lower than the unit delay times of the delay units Rj.

More specifically, as shown in FIG. 6B, each of the delay units Rm and Rn is formed by a NOT gate having the shortest unit delay time among those of various types of logic elements, and each delay unit Rj is formed by an NAND gate or an XNOR gate having the unit delay time longer than the NOT gate so as to substantially equalize the intra-string delay times Tdj with the inter-string delay times Tdm and Tdn. In case of the NAND gate forming each delay unit Rj, the high level signal is always inputted to one input terminal of the NAND gate of each of the delay units R2 to Rm-1, and Rm+1 to Rn-1 to actuate the delay units as inverters.

The latch circuits L1 to Lm are, respectively, arranged in logic cells of the cell string CC1 adjacent to the cell string CC2 on the FPGA such that the position of each latch circuit in the cell string CC1 is the same as the position of the corresponding delay unit in the cell string CC2. The latch circuits Lm+1 to Ln are, respectively, arranged in logic cells of the cell string CC4 adjacent to the cell string CC3 on the FPGA such that the position of each latch circuit in the cell string CC4 is the same as the position of the corresponding delay unit in the cell string CC3. Therefore, the latch circuit Li and the delay unit Ri (i=1, 2, - - - , n) are adjacent to each other in the row direction.

With this placement of the delay units in the pulse delay circuit 20, because the unit delay times of the delay units Rm and Rn are set to be lower than the unit delay times of the delay units Rj, the intra-string delay times Tdj are substantially equalized with the inter-string delay times Tdm and Tdn.

Accordingly, effects can be obtained in the same manner as in the third embodiment.

In this modification, the unit delay times of the delay units Rm and Rn are set to be lower than the unit delay times of the delay units Rj (j=1, 2, - - - , m-1, m+1, - - - , n-1) to substantially equalize the intra-string delay times Tdj with the inter-string delay times Tdm and Tdn. However, in place of the adjustment of the unit delay times, the distance between the delay units Rj and Rj+1 in each pair may be set at an adjusted value such that the common value of the intra-string delay times Tdj is substantially equalized with the common value of the inter-string delay times Tdm and Tdn. Further, in addition to the adjustment of the unit delay times, the distance between the delay units Rj and Rj+1 in each pair may be appropriately adjusted to substantially equalize the intra-string delay times Tdj with the inter-string delay times Tdm and Tdn.

Fourth Embodiment

In this embodiment, the delay units R1 to Rn to be connected with one another in a ring shape are manually placed in a single cell string on the FPGA.

Figure 7A:
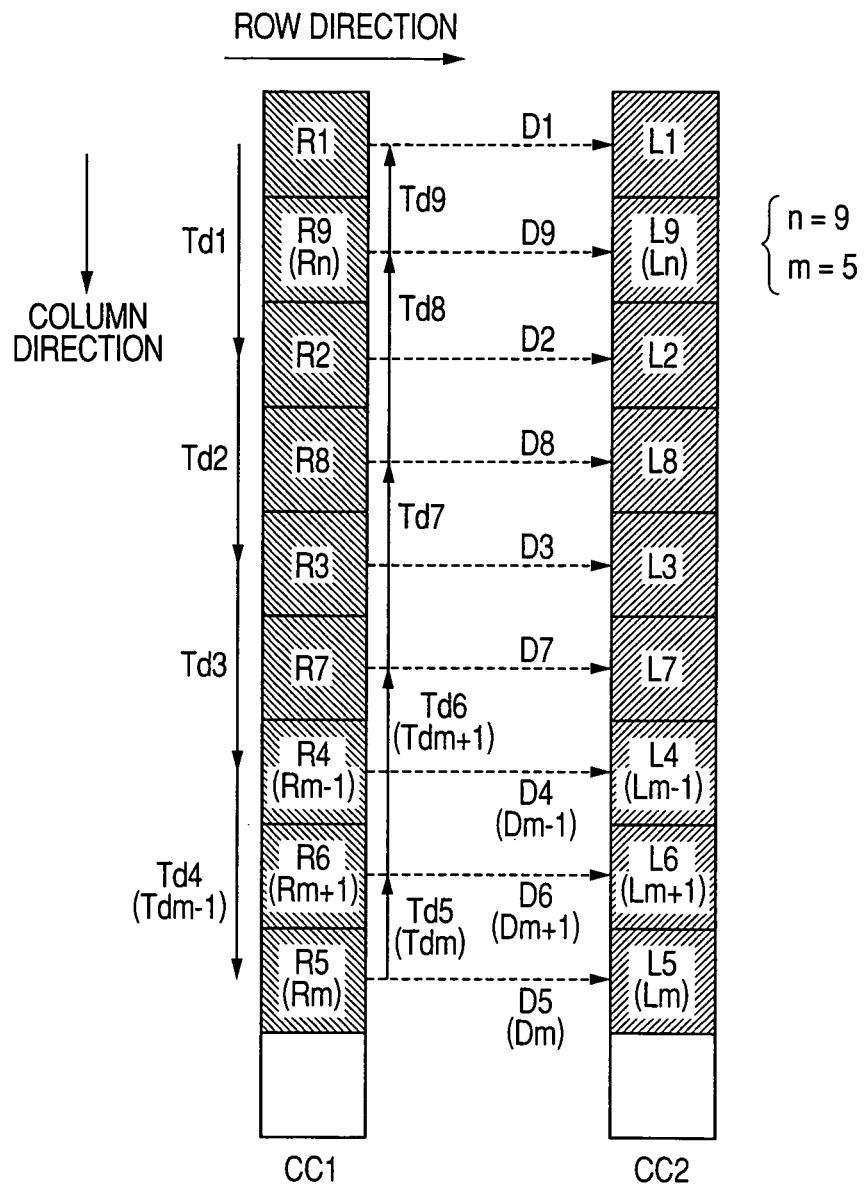
FIG. 7A is a view showing the placement of delay units and latch circuits of the pulse delay circuit on an FPGA according to the fourth embodiment.
Figure 7B:
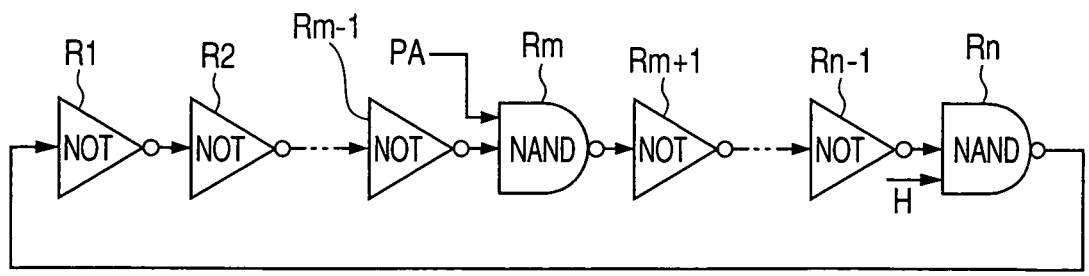
FIG. 7B is a view showing delay units formed by NAND gates and NOT gates according to the fourth embodiment.

FIG. 7A is a view showing the manual placement of the delay units R1 to R9 and latch circuits L1 to L9 of the pulse delay circuit 20 shown in FIG. 4 on the FPGA according to the fourth embodiment. FIG. 7B is a view showing delay units formed by NAND gates and NOT gates according to the fourth embodiment As shown in FIG. 7A, the delay units R1 to Rn (e.g., n=9) are, respectively, arranged in specific logic cells of a single cell string CC1. The delay units R1 to Rm (m=(n+1)/2) are placed at equal intervals (e.g., every two logic cells) to be aligned in the column direction in that order and to be spaced from one another. The delay units Rm+1 to Rn are placed at the equal intervals (e.g., every two logic cells) to be aligned in the direction opposite to the column direction in that order and to place each of the delay units Rm+1 to Rn between two delay units included in the delay units R1 to Rm. More specifically, each delay unit R2m-i (i=1, - - - , m-1) included in the delay units Rm+1 to Rn is placed between the delay units Ri and Ri+1 included in the delay units R1 to Rm. Therefore, the delay unit Rn is arranged to be closest to the delay unit R1 among the delay units Rm+1 to Rn.

Then, the delay units R1 to Rn are connected with one another in that order while connecting the delay units R1 and Rn with each other. Therefore, the delay units R1 to Rn are placed in the connection order in a ring shape.

The specific logic cells for the delay units R1 to Rn in the cell string CC1 are determined such that the intervals of the delay units R1 to Rm are the same as the intervals of the delay units Rm+1 to Rn. Therefore, the intra-string delay times Tdj (j=1, 2, - - -, m−1, m+1, - - -, n−1) are substantially equalized with one another. Further, the delay unit Rm+1 is placed between the delay units Rm−1 and Rm, so that the delay unit Rn is placed between the delay units R1 and R2. Moreover, the delay unit Rm+1 is placed to equalize the distance between the delay units Rm and Rm+1 with the distance between the delay units Rm−1 and Rm+1. Therefore, the intra-string delay times Tdm and Tdn are substantially equalized with each other.

For example, the delay units R1 to Rm placed every two logic cells and the delay units Rm+1 to Rn placed every two logic cells are successively placed in the cell string C1.

In these delay units, because of the delay unit Rm+1 placed between the delay units Rm−1 and Rm and the delay unit Rn placed between the delay units R1 and R2, the distance between the delay units Rm and Rm+1 and the distance between the delay units Rn and R1 becomes shorter than the distance between the delay units Rj and Rj+1. In this case, the transmission delay time on the intra-string line between the delay units Rm and Rm+1 and the transmission delay time on the intra-string line between the delay units Rn and R1 become shorter than the transmission delay time on the intra-string line between the delay units Rj and Rj+1. Therefore, assuming that the unit delay times of the delay units R1 to Rn are equal to one another, the intra-string delay times Tdm and Tdn become shorter than the intra-string delay times Tdj.

In this embodiment, to equalize the intra-string delay times Tdj with the intra-string delay times Tdm and Tdn, the unit delay times of the delay units Rj are set to be lower than the unit delay times of the delay units Rm and Rn. More specifically, as shown in FIG. 7B, each delay unit Rj is formed by a NOT gate having the shortest unit delay time among those of various types of logic elements, and each of the delay units Rm and Rn is formed by an NAND gate or an XNOR gate having the unit delay time longer than that of the NOT gate so as to substantially equalize the intra-string delay times Tdj with the intra-string delay times Tdm and Tdn.

The latch circuits L1 to Ln are, respectively, arranged in logic cells of the cell string CC2 adjacent to the cell string CC1 such that the position of each latch circuit Li (i=1, 2, - - -, n) in the cell string CC2 is the same as the position of the corresponding delay unit Ri in the cell string CC1. Therefore, the latch circuit Li and the delay unit Ri are adjacent to each other in the row direction.

With this placement of the delay units in the pulse delay circuit 20, even when the delay units R1 to Rn of the pulse delay circuit 20 structured as the ring delay line (RDL) are arranged in the same cell string on the FPGA, the intra-string delay times Tdi (i=1, 2, - - -, n) can be substantially equalized with one another by adjusting the unit delay times of the delay units Ri.

Accordingly, although the time measuring device 2 is realized in the FPGA representing the PLD, the detected period of time can be always obtained at the uniform resolution in the same manner as in the third embodiment.

Modification of Fourth Embodiment

Figure 8:
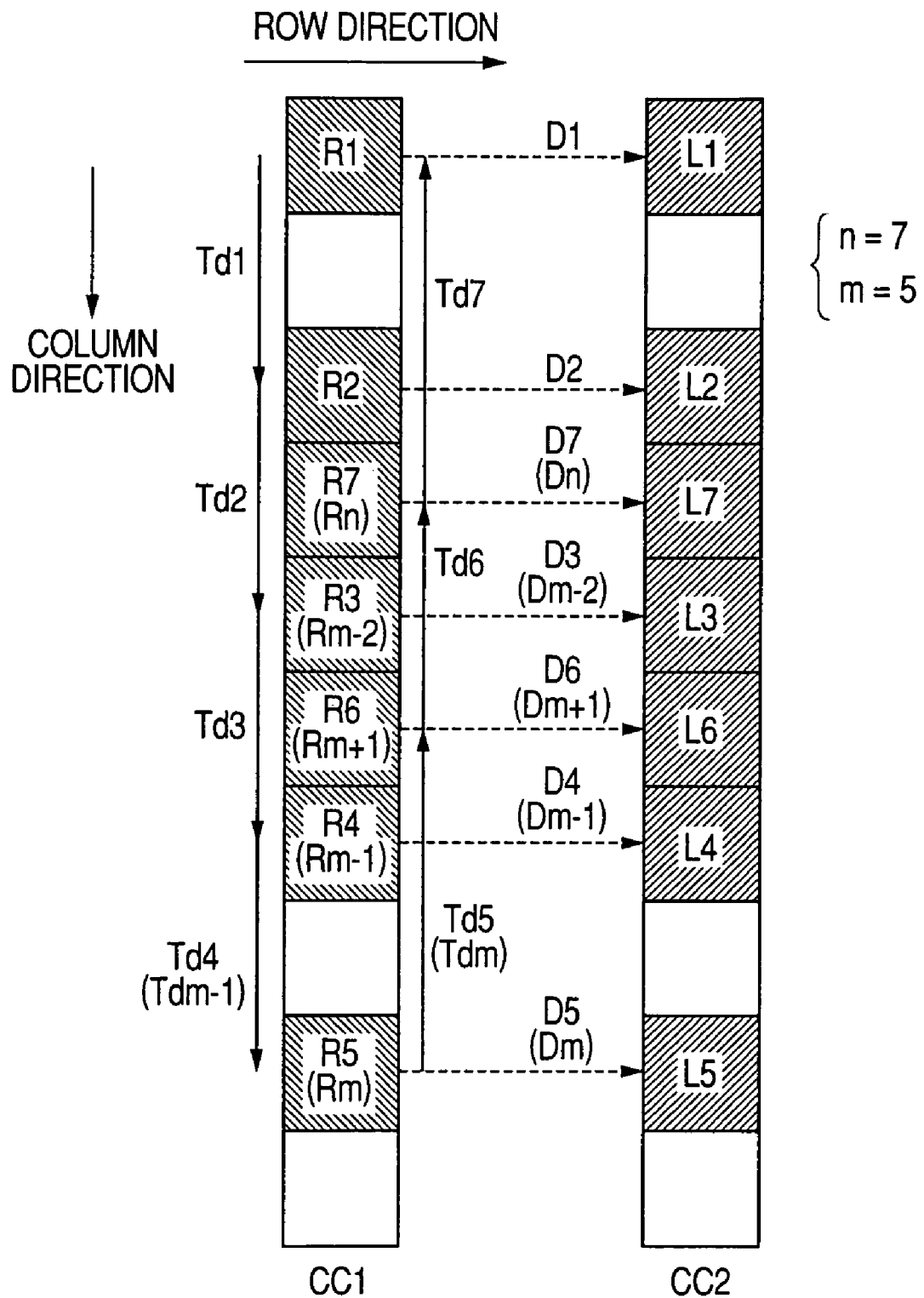
FIG. 8 is a view showing the placement of delay units and latch circuits of the pulse delay circuit on an FPGA according to a modification of the fourth embodiment.

In this modification, the delay units R1 to Rn to be connected with one another in a ring shape are manually placed in a single cell string on the FPGA while spacing the delay units R1 to Rn approximately at equal intervals. FIG. 8 is a view showing the manual placement of the delay units R1 to R7 and latch circuits L1 to L7 of the pulse delay circuit 20 shown in FIG. 4 on the FPGA according to the modification of the fourth embodiment.

As shown in FIG. 8, the delay units R1 to Rn (e.g., n=7) of the circuit 20 are, respectively, arranged in specific logic cells of the same cell string CC1. A first part of delay units R1 to Rm (m=(n+3)/2) are placed at equal intervals (e.g., every two logic cells) to be aligned in the column direction in that order and to be spaced from one another. A second part of delay units Rm+1 to Rn are placed at the equal intervals (e.g., every two logic cells) to be aligned in the direction opposite to the column direction in that order and to place each of the delay units Rm+1 to Rn between two delay units included in the delay units R2 to Rm−1 other than the delay units R1 and Rm placed on both ends of the first part of delay units R1 to Rm. More specifically, each delay unit Rn−i+2 (i=2, - - -, m−2) of the second part is placed between the delay units Ri and Ri+1.

Then, the delay units R1 to Rn are connected with one another in that order while connecting the delay units R1 and Rn with each other. Therefore, the delay units R1 to Rn are placed in the connection order in a ring shape.

With this placement of the delay units, because the intervals of the delay units R1 to Rm are the same as the intervals of the delay units Rm+1 to Rn, the intra-string delay times Tdj (j=1, 2, - - -, m−1, m+1, - - -, n−1) are substantially equalized with one another. Further, the delay unit Rm+1 is placed at the mid point between the delay units Rm−2 and Rm−1 to equalize the distance between the delay units Rm and Rm+1 with the distance between the delay units Rn and R1. Therefore, the intra-string delay times Tdm and Tdn are substantially equalized with each other.

For example, the delay units R2 to Rm−1 placed every two logic cells and the delay units Rm+1 to Rn placed every two logic cells are successively placed in the cell string C1. Each of the delay units R1 and Rm is spaced from the delay units R2 to Rm−1 and the delay units Rm+1 to Rn.

The latch circuits L1 to Ln are, respectively, arranged in logic cells of the cell string CC2 adjacent to the cell string CC1 such that the position of each latch circuit Li (i=1, 2, - - -, n) in the cell string CC2 is the same as the position of the corresponding delay unit Ri in the cell string CC1. Therefore, the latch circuit Li and the delay unit Ri are adjacent to each other in the row direction.

With this placement of the delay units in the pulse delay circuit 20, the distance between the delay units Rm and Rm+1 and the distance between the delay units Rn and R1 are slightly longer than the distance between the delay units Rj and Rj+1 (j=2, - - -, m−1, m+1, - - -, n−1). In this case, the transmission delay time on the intra-string line between the delay units Rm and Rm+1 and the transmission delay time on the intra-string line between the delay units Rn and R1 become slightly longer than the second transmission delay time on the intra-string line between the delay units Rj and Rj+1.

This difference between the transmission delay times is negligible. The reason is as follows. The distance of the delay units Rm and Rm+1 (or the delay units Rn and R1) is 1.5 times of the distance of the delay units Rj and Rj+1. Therefore, as compared with the placement of the delay units in the circuit 20 shown in FIG. 7A where the distance of the delay units Rj and Rj+1 is twice of the distance of the delay units Rm and Rm+1 (or the delay units Rn and R1), the transmission delay time between the delay units Rm and Rm+1 (or the delay units Rn and R1) is approximately equal to the transmission delay time between the delay units Rj and Rj+1. That is, when each of the delay units R2 to Rn is formed by a NOT gate, the intra-string delay times Tdm and Tdn are approximately equal to the intra-string delay times Tdj.

Accordingly, even when the delay units R1 to Rn of the pulse delay circuit 20 structured by the ring delay line (RDL) are arranged in a single cell string on the FPGA, the intra-string delay times Td1 to TDn can be approximately equalized with one another while forming each of the delay units R2 to Rn by a NOT gate, and the detected period of time can be always obtained at the uniform resolution in the time measuring device 2 realized in the FPGA representing the PLD.

In this modification, it is estimated that the intra-string delay times Tdm and Tdn are approximately equal to the intra-string delay times Tdj, so that each of the delay units R2 to Rn is formed by a NOT gate. However, to equalize the intra-string delay times Tdj with the intra-string delay times Tdm and Tdn, the unit delay times of the delay units Rm and Rn may be set to be lower than the unit delay times of the delay units Rj. More specifically, each of the delay units Rm and Rn is formed by a NOT gate having the shortest unit delay time among those of various types of logic elements, and each delay unit Rj is formed by an NAND gate or an XNOR gate having the unit delay time longer than that of the NOT gate so as to substantially equalize the intra-string delay times Tdj with the intra-string delay times Tdm and Tdn.

Fifth Embodiment

Figure 9:
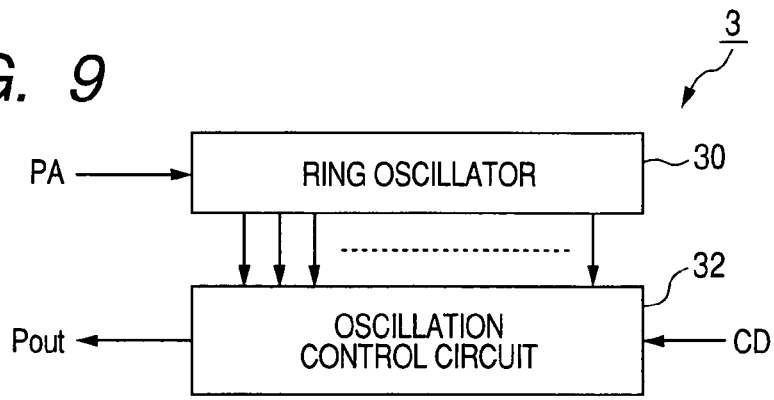
FIG. 9 is a block diagram of a digital control oscillating device having a pulse delay circuit according to the fifth embodiment of the present invention.
Figure 10:
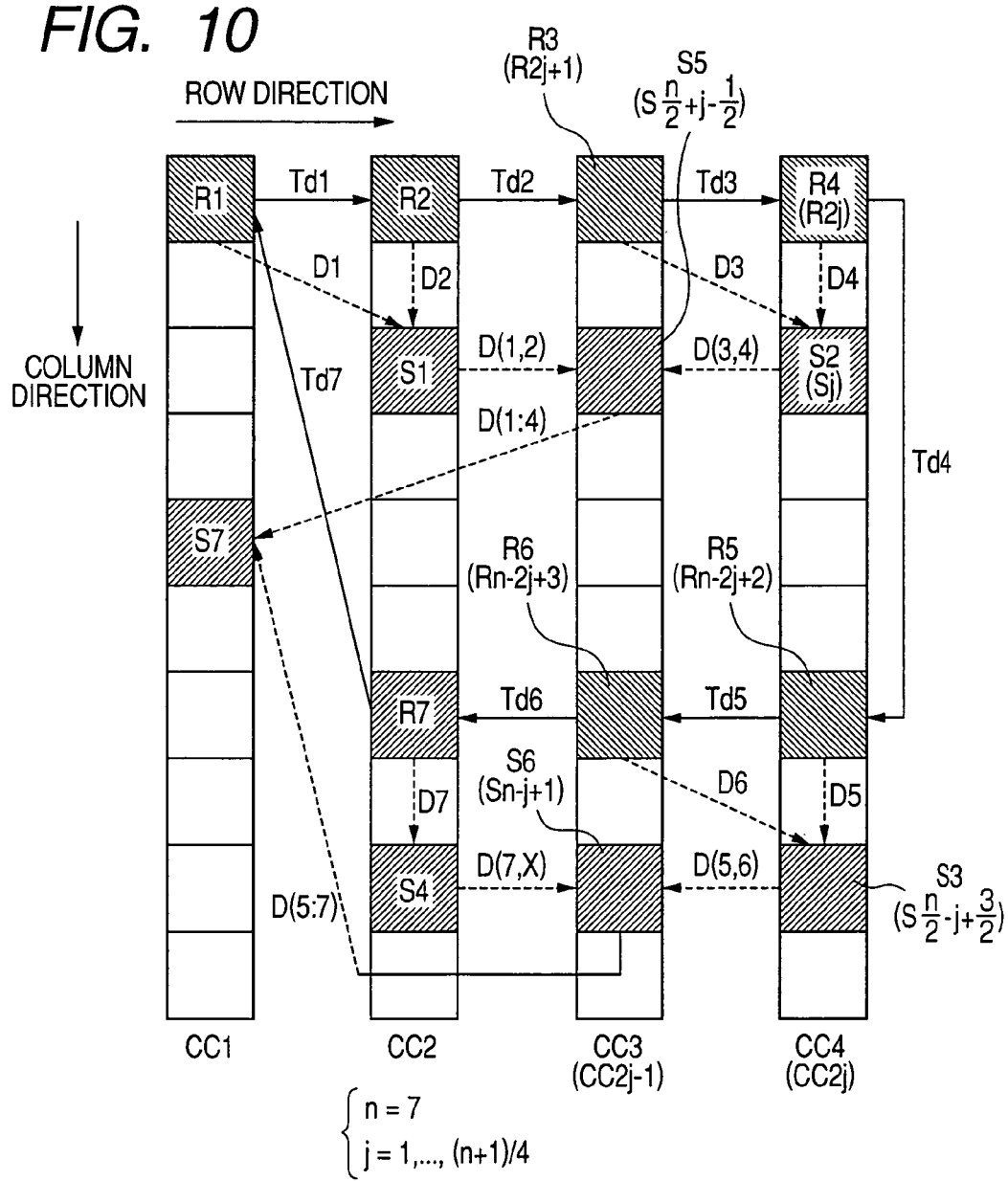
FIG. 10 is a view showing the placement of delay units and selecting units of the pulse delay circuit on an FPGA according to the fifth embodiment.

FIG. 9 is a block diagram of a digital control oscillating device having a pulse delay circuit according to the fifth embodiment, while FIG. 10 is a view showing the manual placement of delay units and selecting units of the circuit on the FPGA.

As shown in FIG. 9 and FIG. 10, a digital control oscillating device 3 has a ring oscillator 30 and an oscillation control circuit 32. The oscillator 30 has a pulse delay circuit composed of a plurality of delay units R1 to Rn (e.g., n is an odd number higher than 1), a plurality of selecting units S1 to Sn and a counter (not shown). These delay units R1 to Rn are structured in the same manner as the delay units R1 to Rn shown in FIG. 4 and FIG. 5. The pulse PA is repeatedly circulated through the delay units R1 to Rn, and the counter counts the number of circulations. The group of selecting units Si to Sn receives the delayed signals D1 to Dn. The circuit 32 selects one delayed signal Di (i=1, 2, - - - , n) delayed in the delay unit Ri and on the line between two delay units Ri and Ri+1 by the delay time Tdi according to control data CD, detects a timing that the number of circulations counted in the counter reaches a controlled value Nc indicated by the control data CD, detects the delayed signal Di transmitted from the group of selecting units S1 to Sn after the detected timing, detects a period of time from the inputting of the signal PA to the detection of the delayed signal Di, and outputs a signal Pout indicating the detected period of time. This detected period of time Tout is expressed by Tout=Nc×(Td1+ - - - +Tdn)+(Td1+ - - - +Tdi). Therefore, this device 3 can control an oscillation cycle to the detected period of time Tout.

This device described above is, for example, disclosed in detail in Published Japanese Patent First Publication No. H07-106923.

Further, in this embodiment, the delay units R1 to Rn and the selecting units S1 to Sn are manually placed on the FPGA. The circuit 32 has a pulse selector (not shown) for controlling the selecting units S1 to Sn to detect one delayed signal Di selected in the selecting units S1 to Sn.

As shown in FIG. 10, the delay units R1 to Rn (e.g., n=7) are arranged on the FPGA so as to place the delay units R1 to Rn in the same manner as the placement of the delay units R1 to Rn shown in FIG. 5. When the number n+1 is, for example, an amplitude of 4, the selecting unit Sj (j=1, - - - , (n+1)/4) is arranged in the cell string CC2j having the delay unit R2j to select one of delayed signals D2j−1 and D2j. The selecting unit Sn/2+j−1/2 (j≧2) is arranged in the cell string CC2j−1 having the delay unit R2j−1 to select one of delayed signals selected in two selecting units. The selecting unit Sn−j+1 (j=1, - - - , (n+1)/4) is arranged in the cell string CC2j−1 having the delay unit Rn−2j+3 (j≧2) to select one of delayed signals selected in two selecting units. The selecting unit Sn/2−j+3/2 is arranged in the cell string CC2j having the delay unit Rn−2j+2 to select one of delayed signals Dn−2j+2 and Dn−2j+3. Therefore, only the selecting unit Sn is arranged in the cell string CC1 having the delay unit R1.

For example, in case of n=7, the selecting unit S1 is arranged in the cell string CC2 having the delay unit R2 to select one of delayed signals D1 and D2. The selecting unit S2 is arranged in the cell string CC4 having the delay unit R4 to select one of delayed signals D3 and D4. The selecting unit S3 is arranged in the cell string CC4 having the delay unit R5 to select one of delayed signals D5 and D6. The selecting unit S4 is arranged in the cell string CC2 having the delay unit R7 to select the delayed signal D7. The selecting unit S5 is arranged in the cell string CC3 having the delay unit R3 to select either the output D(1, 2) of the selecting unit S1 or the output D(3, 4) of the selecting unit S2. The selecting unit S6 is arranged in the cell string CC3 having the delay unit R6 to select either the output D(5, 6) of the selecting unit S3 or the output D(7, x) of the selecting unit S7. The selecting unit S7 is arranged in the cell string CC1 having the delay unit R1 to select either the output D(1; 4) of the selecting unit S5 or the output D(5; 7) of the selecting unit S6.

The selecting units S1, S5 and S2 in the first group are, respectively, placed such that the relative positions of the selecting units to the corresponding delay units R2, R3 and R4 are the same as one another. The selecting units S3, S6 and S4 in the second group are, respectively, placed such that the relative positions of the selecting units to the corresponding delay units R5, R6 and R7 are the same as one another. The selecting unit S7 is placed almost at the midpoint between the first group of selecting units and the second group of selecting units in the column direction.

With this placement of the selecting circuits S1 to S7, the number of selecting circuits, through which the delayed signal Di selected by the pulse selector passes, is constant. Further, the length of the passage from the ring delay line to the selecting circuit Sn is constant regardless of selecting circuits through which the delayed signal Di is transmitted to the selecting circuit Sn.

Accordingly, not only the delay times Td1 to Tdn are equalized with each other, but also the delayed signal Di obtained from the selecting circuit Sn can be delayed by a fixed time between the ring delay line and the selecting circuit Sn. In this case, the period of time from the inputting of the signal PA to the detection of the delayed signal Di can be set with high precision, so that the phase of the output signal Pout can be appropriately adjusted so as to detect the period of time at the uniform resolution.

Sixth Embodiment

Figure 11:
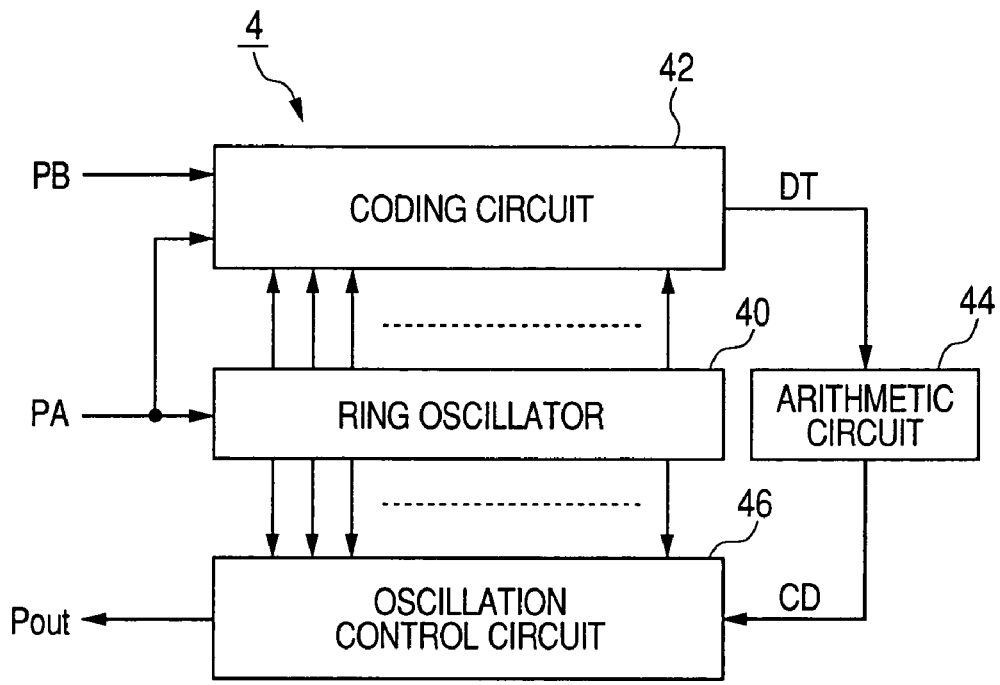
FIG. 11 is a block diagram of a clock generating device having a pulse delay circuit according to the sixth embodiment of the present invention.

FIG. 11 is a block diagram of a clock generating device having a pulse delay circuit according to the sixth embodiment.

As shown in FIG. 11, a clock generating device 4 has a ring oscillator 40, a coding circuit 42, an arithmetic circuit 44 and an oscillation control circuit 46. The oscillator 40 has a plurality of delay units R1 to Rn, a plurality of latch circuits L1 to Ln and a plurality of selecting circuits S1 to Sn. The delay units R1 to Rn and the latch circuits L1 to Ln of the ring oscillator 40 have the same configuration as those of the time measuring circuit 2 shown in FIG. 4. The delay units R1 to Rn and the selecting circuits S1 to Sn of the ring oscillator 40 have the same configuration as those of the ring oscillator 30 shown in FIG. 9. The coding circuit 42 has the same configuration as that of the coding circuit 22 shown in FIG. 4. The circuit 46 has the same configuration as the circuit 32 shown in FIG. 9. Therefore, the circuits 42 and 46 and the oscillator 40 in the device 4 have the structure obtained by combining the device 2 shown in FIG. 2 and the device shown in FIG. 9.

The circuit 42 produces digital data DT, indicating the cycle of a reference signal PB, from delayed signals D1 to Dn of the oscillator 40. The circuit 44 produces control data CD indicating an output cycle of a clock signal by multiplying or dividing the digital data DT by a setting value Ns. The circuit 46 produces a clock signal Pout from the control data CD and the outputs D1 to Dn of the oscillator 40. The frequency of this signal Pout is equal to the frequency obtained by multiplying or dividing the frequency of the signal PB by the setting value Ns.

The device 4 described above is, for example, disclosed in detail in Published Japanese Patent First Publication No. H07-183800. Therefore, more detailed description of the configuration and function of the device 4 is omitted.

Further, in this embodiment, the delay units R1 to Rn and the latch circuits L1 to Ln of the ring oscillator 40 are arranged on the FPGA to have the same placement as those shown in FIG. 7A or FIG. 8. Therefore, the delay units R1 to Rn are placed in a line in the cell string CC1. The selecting circuits S1 to Sn of the ring oscillator 40 are arranged in another cell string of the FPGA adjacent to the cell string CC1 such that the row directional relative positions of the selecting circuits S1 to Sn to the corresponding delay units in the ring oscillator 40 are the same as the column directional relative positions of the selecting circuits Si to Sn to the corresponding delay units in the ring oscillator 30.

The circuit 42 is disposed to place the cell string CC2 of the latch circuits L1 to Ln between the cell string CC1 and the circuit 42. The circuit 46 is disposed to place the cell string of the selecting circuits S1 to Sn between the cell string CC1 and the circuit 46.

Accordingly, the transmission delays of the delayed signals D1 to Dn from the oscillator 40 to each of the circuits 42 and 46 can be equalized with one another and be minimized, so that the clock signal Pout can be controlled with the highest precision.

Modification of Sixth Embodiment

Figure 12:
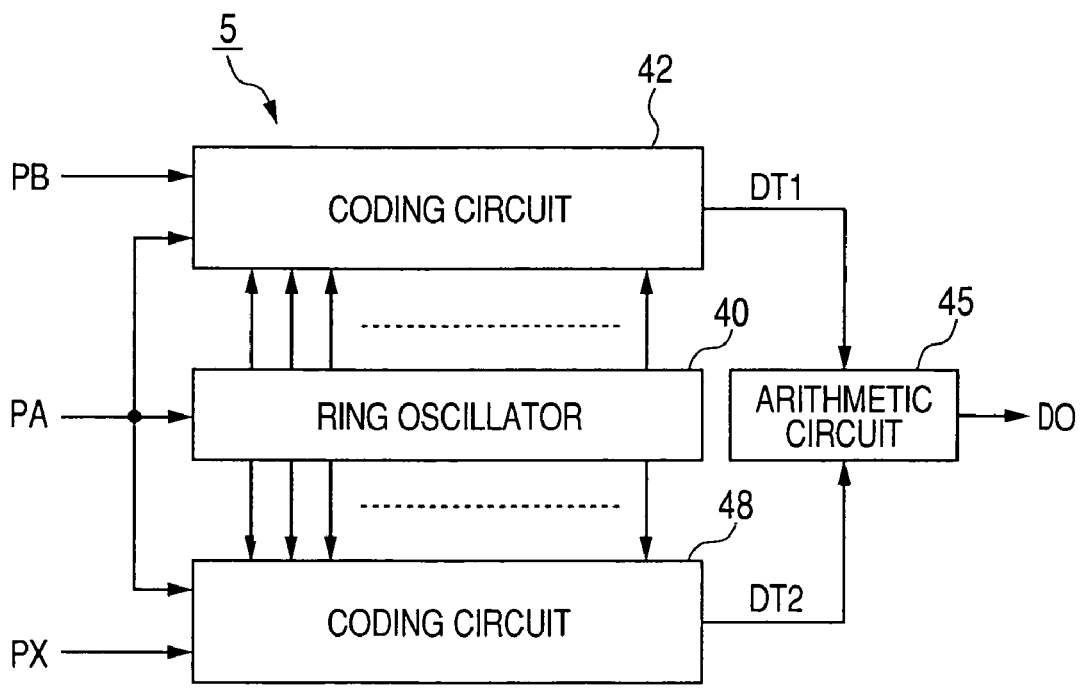
FIG. 12 is a block diagram of a cycle measuring device having a pulse delay circuit according to the modification of the sixth embodiment.

FIG. 12 is a block diagram of a cycle measuring device having a pulse delay circuit according to the modification of the sixth embodiment.

As shown in FIG. 12, a cycle measuring device 5 has the ring oscillator 40, the coding circuit 42, a coding circuit 48 and an arithmetic circuit 45. The circuit 48 has the same configuration as that of the coding circuit 22 shown in FIG. 4. The circuit 48 produces digital data DT2, indicating the cycle of a measured signal PX, from the delayed signals D1 to Dn of the oscillator 40. The circuit 45 divides the digital data DT2 of the circuit 48 by the digital data DT1 of the circuit 42 to produce digital data D0 indicating the ratio of the cycle of the measured signal PX to the cycle of the reference signal PB. The cycle of the measured signal PX is measured from this digital data D0.

Accordingly, the transmission delays of the delayed signals D1 to Dn from the oscillator 40 to each of the circuits 42 and 48 can be equalized with one another and be minimized, so that the cycle of the measured signal PX can be measured with the highest precision.

The oscillator 40 may have another group of latch circuits L1 to Ln arranged in another cell string of the FPGA adjacent to the cell string CC1 such that these latch circuits L1 to Ln have the same placement as those of the cell string CC2. In this case, the circuit 48 is disposed to place these latch circuits L1 to Ln between the cell string CC1 and the circuit 48.

These embodiments should not be construed as limiting the present invention to structures of those embodiments, and the placing method of this invention may be combined with that based on the prior art. For example, in these embodiments, the delay units are arranged on the FPGA. However, the delay units may be placed in any programmable logic device when the intra-string delay time differs from the inter-string delay time in this logic device.

What is claimed is:

1. A pulse delay circuit on a programmable logic device, comprising:
    a plurality of delay units;
    a plurality of logic cells in each of a plurality of cell strings in which an inter-string transmission delay time on a line between two logic cells of different cell strings differs from an intra-string transmission delay time on a line between two logic cells of one cell string;
    wherein
    each of delay units is arranged in one logic cell of the programmable logic device such that the delay units are placed in the logic cells of a single specific cell string included in the cell strings, and
    the delay units are connected in a ring shape such that a first part of the delay units, consecutively aligned in a connection order of the delay units, is placed along an aligning direction of the logic cells of the specific cell string and a second part of the delay units, consecutively aligned in the connection order, is placed along a direction opposite to the aligning direction.

2. A pulse delay circuit on a programmable logic device according to claim 1, wherein:
    the delay units are set at an odd number expressed by N,
    the first part of the delay units, set at a number of (N+1)/2, is connected so as to space the first part of the delay units from one another by a specific number of logic cells in the specific cell string; and
    the second part of the delay units, set at a number of (N−1)/2, is connected so as to space the second part of the delay units from one another by the specific number of logic cells in the specific cell string while each delay unit, included in the second part of the delay units, is placed between two delay units included in the first part of the delay units.

3. A pulse delay circuit on a programmable logic device according to claim 2, further comprising:
    a first delay unit formed in the first part of the delay units by a first logic element; and
    a second delay unit formed in the second part of the delay units by the first logic element; wherein;
    each of the delay units other than the first delay unit and the second delay unit is formed by a second logic element having a delay time shorter than a delay time of the first logic element, the first delay unit is connected with a third delay unit in the second part of the delay units to transmit a signal delayed in the first delay unit to the third delay unit, and the second delay unit is connected with a fourth delay unit in the first part of the delay units to transmit the signal delayed in the second delay unit to the fourth delay unit.

4. A pulse delay circuit on a programmable logic device according to claim 1, wherein;

the delay units are set at an odd number expressed by N, the first part of the delay units set at a number of (N+3)/2 is connected so as to space the first part of the delay units from one another by a specific number of logic cells in the specific cell string; and the second part of the delay units set at a number of (N−3)/2 is connected so as to space the second part of the delay units from one another by the specific number of logic cells in the specific cell string while each delay unit, included in the second part of the delay units, is placed between two delay units included in the first part of the delay units other than two delay units placed on both ends of the first part of the delay units.

5. A pulse delay circuit on a programmable logic device, comprising:

a plurality of delay units;

a plurality of logic cells in each of a plurality of cell strings in which an inter-string transmission delay time on a line between two logic cells of different cell strings differs from an intra-string transmission delay time on a line between two logic cells successively aligned in one cell string;

wherein each of the delay units in one logic cell of the programmable logic device is arranged so as to place the delay units in a plurality of specific cell strings, included in the cell strings, in a transmission order and to place a part of the delay units, consecutively aligned in the transmission order, in one specific cell string at specific intervals such that the intra-string transmission delay time on a line between two delay units, spaced by the specific interval, in the part of the delay units is substantially equalized with the inter-string transmission delay time on a line between two delay units consecutively aligned in the transmission order in two specific cell strings; and two delay units, consecutively aligned in the transmission order, are connected in each pair with each other so as to transmit a signal through the delay units in the transmission order.

6. A pulse delay circuit on a programmable logic device according to claim 5, wherein each of the delay units includes:

one delay unit in one specific cell string, different from the specific cell string of the part of the delay units, arranged as a first delay unit;

two delay units in each of the specific cell strings, other than the specific cell string of the top delay unit and the specific cell string of the part of the delay units, arranged as a second delay unit and a third delay unit;

the part of the delay units are serially connected in the transmission order, and the first delay unit, the second delay units, the part of the delay units aligned in the transmission order, the third delay units and the first delay unit are serially connected with one another in that order to connect the delay units of the pulse delay circuit in a ring shape.

7. A pulse delay circuit on a programmable logic device according to claim 6, wherein positions of the logic cells of the first delay unit, the second delay units and one delay unit preceding the other delay units in the part of the delay units in the transmission order are the same in the specific cell strings, and positions of the logic cells of the third delay units and one delay unit succeeding the other delay units in the part of the delay units in the transmission order are the same in the corresponding specific cell strings.

8. A pulse delay circuit on a programmable logic device according to claim 5, wherein the part of the delay units is arranged at equal intervals in the specific cell string; and the delay units other than the part of the delay units in one specific cell string, different from the specific cell string of the part of the delay units, are arranged at the equal intervals.

9. A pulse delay circuit on a programmable logic device according to claim 5, wherein a signal is delayed in each delay unit by a unit delay time which is changed with a driving voltage applied to the delay unit, the programmable logic device has a plurality of power sources having respective driving voltages set at different values, and the programmable logic device applies the driving voltage of one power source to the delay units.

10. A pulse delay circuit on a programmable logic device, comprising:

a plurality of delay units;

a plurality of logic cells in each of a plurality of cell strings in which an inter-string transmission delay time on a line between two logic cells of different cell strings is longer than an intra-string transmission delay time on a line between two logic cells of one cell string; wherein each of the delay units in one logic cell of the programmable logic device is arranged so as to place the delay units in a plurality of specific cell strings, included in the cell strings, in a transmission order and to place a part of the delay units, consecutively aligned in the transmission order, in one specific cell string;

each delay unit is formed, preceding another delay unit in the transmission order in the part of the delay units, by a first logic element having a first delay time;

each of the delay units other than the delay unit or the delay units, formed by the first logic element or the first logic elements, is formed by a second logic element having a second delay time shorter than the first delay time of the first logic element; and two delay units, consecutively aligned in the transmission order, are connected in each pair with each other so as to transmit a signal through the delay units in the transmission order.

11. A pulse delay circuit on a programmable logic device according to claim 10, wherein a signal is delayed in each delay unit by a unit delay time which is changed with a driving voltage applied to the delay unit, the programmable logic device has a plurality of power sources having respective driving voltages set at different values, and the programmable logic device applies the driving voltage of one power source to the delay units.

* * * * *